United States Patent
Maris

(10) Patent No.: US 10,113,861 B2
(45) Date of Patent: Oct. 30, 2018

(54) OPTICAL SYSTEM AND METHODS FOR THE DETERMINATION OF STRESS IN A SUBSTRATE

(71) Applicant: BROWN UNIVERSITY, Providence, RI (US)

(72) Inventor: Humphrey J. Maris, Barrington, RI (US)

(73) Assignee: BROWN UNIVERSITY, Providence, RI (US)

(*) Notice: Subject to any disclaimer, the term of this patent is extended or adjusted under 35 U.S.C. 154(b) by 9 days.

(21) Appl. No.: 15/313,897

(22) PCT Filed: May 28, 2015

(86) PCT No.: PCT/US2015/033022
§ 371 (c)(1),
(2) Date: Nov. 23, 2016

(87) PCT Pub. No.: WO2015/184162
PCT Pub. Date: Dec. 3, 2015

(65) Prior Publication Data
US 2017/0199027 A1    Jul. 13, 2017

Related U.S. Application Data

(60) Provisional application No. 62/004,663, filed on May 29, 2014.

(51) Int. Cl.
*G01J 3/00*        (2006.01)
*G01B 11/16*    (2006.01)
(Continued)

(52) U.S. Cl.
CPC ............... *G01B 11/16* (2013.01); *G01L 1/24* (2013.01); *H01L 22/12* (2013.01)

(58) Field of Classification Search
CPC .. G01B 11/16; G01L 1/00; G01L 1/24; G01L 1/241; H01L 22/12
(Continued)

(56) References Cited

U.S. PATENT DOCUMENTS 4,710,030 A    12/1987    Tauc et al.
4,812,036 A    3/1989    Inoue
(Continued)

FOREIGN PATENT DOCUMENTS

JP    2009-14606 A    1/2009

OTHER PUBLICATIONS

A.K. Sinha et al., "Thermal stresses and cracking resistance of dielectric films (SiN, Si3N4, and SiO2) on Si Substrates", Journal of Applied Physics, 49(4):2423-2426 (1978).
X. Wu et al., "Micro-Raman spectroscopy measurement of stress in silicon", Microelectronics Journal 38:87-90 (2007).
P.A. Flinn et al., "X-ray diffraction determination of the effect of various passivations on stress in metal films and patterned lines", Journal of Applied Physics 67(6):2927-2931 (1990).
(Continued)

*Primary Examiner* — Hina F Ayub
(74) *Attorney, Agent, or Firm* — Merchant & Gould P.C.

(57) ABSTRACT

Methods and systems are disclosed for measuring multidimensional stress characteristics in a substrate. Generally, the methods include applying a sequence of optical pump pulses to the substrate. The optical pump pulses induce a propagating strain pulse in the substrate. Optical probe pulses are also applied. By analyzing transient optical responses caused by the propagating strain pulse, multidimensional stress components characterizing the stress in the substrate can be determined. Multidimensional stress components may also be determined at a depth of a substrate. Multidimensional stress components may also be determined at areas adjacent a through-silicon via.

35 Claims, 17 Drawing Sheets

(51) Int. Cl.
*G01L 1/24* (2006.01)
*H01L 21/66* (2006.01)

(58) Field of Classification Search
USPC .......................................................... 356/300
See application file for complete search history.

(56) References Cited

U.S. PATENT DOCUMENTS

| | | | |
|---|---|---|---|
| 5,864,393 A | 1/1999 | Maris | |
| 5,912,738 A | 6/1999 | Chason et al. | |
| 5,959,735 A | 9/1999 | Maris et al. | |
| 6,175,416 B1 | 1/2001 | Maris et al. | |
| 6,208,418 B1 | 3/2001 | Maris | |
| 6,321,601 B1* | 11/2001 | Maris | G01B 11/02 73/655 |
| 7,391,523 B1 | 6/2008 | Taylor, II et al. | |
| 7,668,668 B2 | 2/2010 | Naka et al. | |
| 2009/0180747 A1* | 7/2009 | Schrauwen | B82Y 20/00 385/129 |
| 2010/0332203 A1 | 12/2010 | Maris | |
| 2012/0006122 A1* | 1/2012 | Aitken | H01L 22/12 73/763 |
| 2012/0309116 A1 | 12/2012 | Colgan et al. | |
| 2014/0141538 A1 | 5/2014 | Hawryluk et al. | |
| 2014/0268127 A1* | 9/2014 | Day | G01J 3/0291 356/300 |
| 2017/0010540 A1* | 1/2017 | Dmitriev | H01L 22/20 |

OTHER PUBLICATIONS

R.N. Thurston et al., "Third-Order Elastic Constants and the Velocity of Small Amplitude Elastic Waves in Homogeneously Stressed Media", Physical Review 13(6A), A1604-A1610 (1964).
P. Etchegoin et al., "Elasto-optical constants of Si", Physical Review B, 47(16):10 292-10 303 (1993).
H.J. McSkimin et al., "Measurement of Third-Order Moduli of Silicon and Germanium", Journal of Applied Physics 35(11):3312-3319 (1964).
J.R. Drabble et al., "Third Order Elastic Constants of Gallium Arsenide", Solid State Communications 4:467-468 (1966).
P. Etchegoin et al., "Piezo-optical response of Ge in the visible-uv range", Physical Review B 45(20):11 721-11 735 (1992).
P. Etchegoin et al., "Piezo-optics of GaAs", Physical Review B 46(23): 15 139-15 149 (1992).
Bartels et al., "Ultrafast time-domain spectroscopy based on high-speed asynchronous optical sampling", Reviews of Scientific Instruments, 78:035107 (2007).
O.W. Phillion et al., "Subnanosecond relaxation time measurements using a transient grating method", Applied Physics Letters 27(2):85-87 (1975).
International Search Report and Written Opinion for PCT/US2015/033022, dated Aug. 31, 2015.
Search Report for European Patent Application No. 15798838.7, dated Dec. 22, 2017.

\* cited by examiner

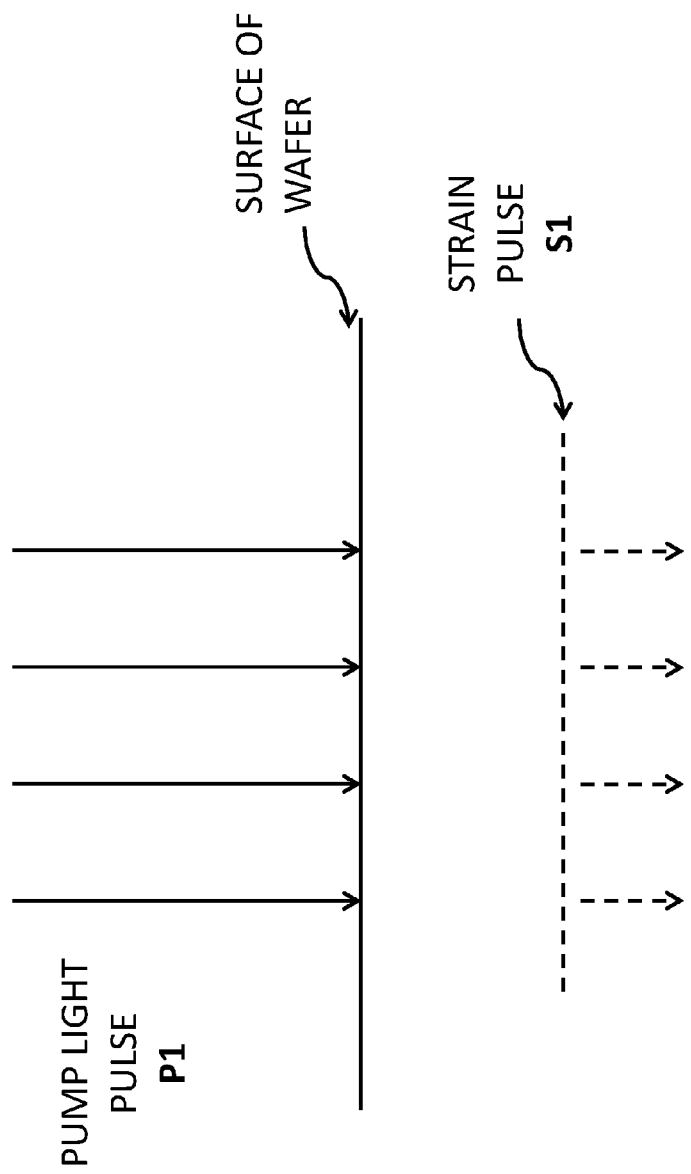

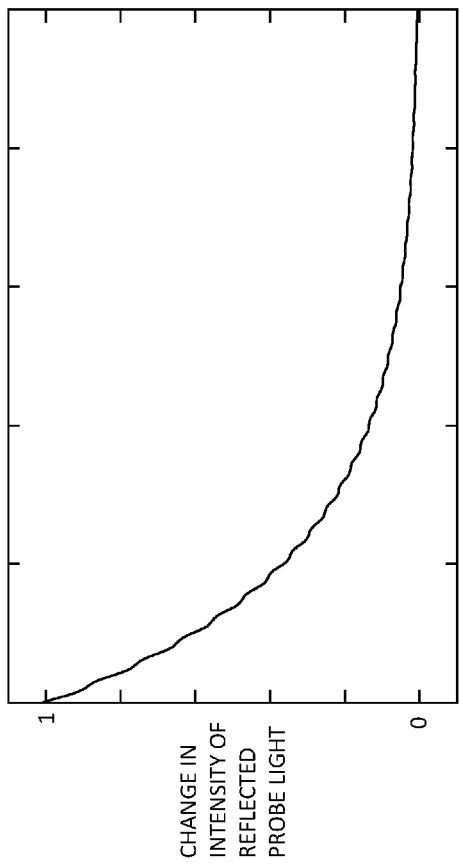
FIG. 4A
FIG. 4B

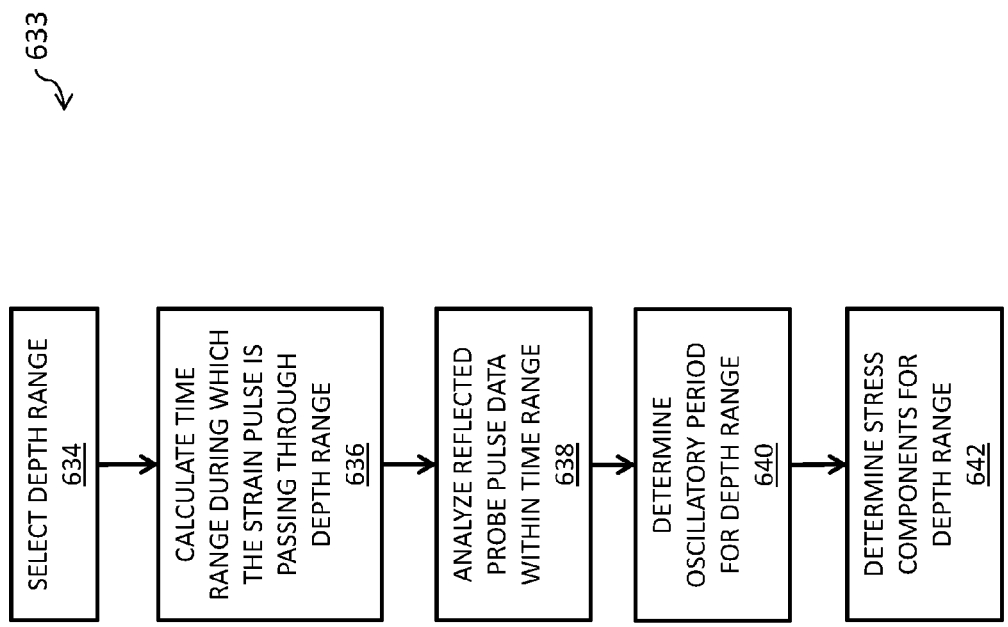

OPTICAL SYSTEM AND METHODS FOR THE DETERMINATION OF STRESS IN A SUBSTRATE

PRIORITY CLAIM

This application is a U.S. National Stage application of PCT International application No. PCT/US2015/033022, which claims the benefit of U.S. Provisional Application No. 62/004,663, filed on May 29, 2014, which applications are incorporated herein by reference. To the extent appropriate, a claim of priority is made to each of the above disclosed applications.

INTRODUCTION

In the semiconductor industry, large scale integrated circuits are fabricated by depositing a sequence of thin films onto a substrate wafer. Metallic films are used to provide the connections between different transistors and insulating films, such as oxides, are used to provide insulation between the metallic layers. Currently, there is much interest in making devices in which there is a stack of silicon wafers. Metal "vias" are used to make electrical connections between the different wafers. To make these vias holes are formed in the silicon wafers and these holes are filled with metal, currently using copper. In some cases the via forming process can result in large stress in the region around each via. This stress can lead to cracking and delamination of the silicon substrate and/or films near to the via. As a result, it is desirable to find ways to determine stress characteristics in semiconductor wafers, preferably by a method which is non-contact, rapid, non-destructive, and capable of giving a value for the stress within a small area of the wafer. It is also desirable to be able to have a method which can determine how the stress varies with distance from the free surface of the wafer.

One known method for the determination of stress is based on a measurement of the curvature of the wafer (see, for example, A. K. Sinha, H. J. Levinstein, and T. E. Smith, Thermal stresses and cracking resistance of dielectric films (SiN, Si3N4, and SiO2), Journal of Applied Physics, 49, 2423 (1978), C. A. Taylor, D. Bartlett, D. Perry, and R. Clarke, U.S. Pat. No. 7,391,523, E. H. Chason, J. A. Floro, C. H. Seager, M. B. Sinclair, U.S. Pat. No. 5,912,738). If the stress is known to be restricted to a certain depth from the surface of the wafer, rather than being uniform throughout the wafer thickness, it will result in a curvature of the wafer. A measurement of this curvature can give information about the magnitude. However, this method is of limited value because a) it gives only information about the stress averaged over a large area of the wafer, b) and to estimate the magnitude of the stress it is necessary to know the depth of the stressed layer from the wafer surface.

Another known method for the determination of the amount of stress in a wafer is based on Raman spectroscopy (see, for example, X. Wu, J. Yu, T. Ren and L. Liu, Micro-Raman spectroscopy measurement of stress in silicon, Microelectronics Journal 38, 87 (2007), Y. Inoue, U.S. Pat. No. 4,812,036), N. Naka and S. Kashiwagi, U.S. Pat. No. 7,668,668 B2). Light of frequency f from a laser is directed onto a region of the surface of the sample. The spectrum of the light returning from the sample is measured. It is found that there is a component of the light which has a frequency shifted from the original frequency f by an amount $f_1$. This is because the light has either excited an optical phonon in the wafer or has absorbed the energy of such a phonon. Any stress in the wafer results in a small change in $f_1$ by an amount which is proportional to the stress in the region of the wafer onto which the light is directed. Consequently, measurement of $f_1$ makes it possible to determine the stress. However, the Raman spectroscopy measurement requires a considerable amount of time to perform which limits its usefulness for the measurement of the stress in substrate wafers in an integrated circuit processing environment.

A third known method to determine the amount of stress in a material uses X-ray diffraction to measure the stress (see, for example, P. A. Flinn and C. Chiang, X-ray diffraction determination of the effect of various passivations on stress in metal films and patterned lines, Journal of Applied Physics, 67, 2927 (1990)). The scattering of X-rays from the wafer is detected and the dimension of a unit cell of the wafer material is determined. By comparison of the measured dimension of the unit cell with the corresponding dimensions of the unit cell in an unstressed bulk sample of the same material, the elastic strain can be determined. From the strain the stress can be calculated using the equations of elasticity. However, this X-ray method has the following limitations: (1) it is difficult to apply to determine the stress in very small areas of a material (for example, areas with linear dimensions 10 microns); and (2) the measurement is time consuming. As a consequence, the X-ray technique also has limited applicability to the measurement of stress in a substrate wafer in an integrated circuit processing environment.

Another method based on the velocity of a strain wave to determine the amount of stress on the surface of a thin film is also known. (See H. J. Maris, U.S. Pat. No. 5,864,393.) By determining the velocity of a strain wave, a surface pressure can be determined. That method, however, is limited in that it only can determine a single pressure with no representation of direction or dimensionality. In addition, this method cannot measure stress at a depth of a material.

Optical System and Method for the Determination of Stress in a Substrate

The present disclosure provides methods and systems for the determination of multidimensional stress components for characterizing the mechanical stress in a substrate wafer. Embodiments of the methods and systems use an optical technique that employs a short optical pulse to generate a mechanical strain pulse, and a second optical pulse to detect the propagation of the strain pulse. By utilizing the methods and systems disclosed herein, the multidimensional stress components may be determined in non-destructive manner with a micron or submicron resolution. One or more embodiments of the methods and systems in the present disclosure overcome the limitations of the past by, at least, providing a multidimensional representation of the stresses of the material. In some embodiments, the multidimensional representation of the stresses of the material can be at a depth within the material, i.e., at a point below a surface of the material.

More particularly, some embodiments of the methods and systems include applying a sequence of optical pump pulses to the substrate. The optical pump pulses induce a propagating strain pulse in the substrate. For each of the optical pump pulses, at least one optical probe pulse is applied. By analyzing transient optical responses caused by the propagating strain pulse, multidimensional stress components characterizing the stress in the substrate can be determined. Determination of the multidimensional stress components are realized by controlling and monitoring multiple polarizations of probe pulses. Orientations of the material may also be manipulated to assist in determining the multidimensional stress components. Multidimensional stress components may also be determined at areas adjacent a through-silicon via.

In general, the systems and methods may employ at least one of a determination of a modulated change $\Delta R$ in an intensity of a reflected portion of a probe pulse, a change $\Delta T$ in an intensity of a transmitted portion of the probe pulse, a change $\Delta P$ in a polarization of the reflected probe pulse, a change $\Delta\phi$ in an optical phase of the reflected probe pulse, and a change in an angle of reflection $\Delta\beta$ of the probe pulse.

The disclosure includes a method for determining multidimensional stress components in a material. The method includes applying a sequence of optical pump pulses to a surface of the material, individual pulses of the optical pump pulses inducing a propagating strain pulse in the material and for at least one of the optical pump pulses, applying at least one optical probe pulse. The method further includes detecting variations in a transient optical response of the material to the optical probe pulses, the variations being due at least in part to the propagation of the strain pulse in the material and based on the detected variations in the transient optical response of the material, determining an oscillatory period for the detected variations. The method also includes comparing the determined oscillatory period to a reference oscillatory period for a substantially unstressed sample having a substantially similar composition as the material; and based on results of the comparing operation, determining at least a first and a second stress component of a stress tensor, wherein the first stress component represents a stress in a first direction and the second stress component represents a stress in a second direction.

The disclosure also includes a method for determining multidimensional stress components in a material using a system where multiple optical probe light pulses are reflected by the material. The method includes measuring intensity of a first reflected probe light pulse having a first polarization, determining a first oscillatory period for a change in intensity of the first reflected probe light pulse, and comparing the first oscillatory period to a reference oscillatory period for a substantially unstressed material. The method further includes measuring intensity of a second reflected probe light pulse having a second polarization, determining a second oscillatory period for a change in intensity of the second reflected probe light pulse, and comparing the second oscillatory period to the reference oscillatory period. The method also includes, based on the comparison operations, determining at least a first and a second stress component of a stress tensor, wherein the first stress component represents a stress in a first direction and the second stress component represents a stress in a second direction.

The disclosure further includes a system for determining multidimensional stress components in a material. The system includes at least one light source, wherein the at least one light source generates an optical pump pulse and a first optical probe pulse, wherein the optical pump pulse and the first optical probe pulses are directed towards a target area; and at least one optical detector, wherein the optical detector detects variations in a transient optical response of the material to the first optical probe pulse, the variations being due at least in part to the propagation of a strain pulse in the material caused by the optical pump pulse. The system also includes a processor configured to determine, based on the detected variations in the transient optical response of the material, a first oscillatory period for the detected variations, compare the determined first oscillatory period to a reference oscillatory period for a substantially unstressed sample having a substantially similar composition as the material, and based on results of the comparison, determine at least a first and a second stress component of a stress tensor, wherein the first stress component represents a stress in a first direction and the second stress component represents a stress in a second direction.

The disclosure also includes another method for determining multidimensional stress components in a material. The method includes directing a first optical pump pulse and a second optical pump pulse towards the material, wherein the first optical pump pulse and the second optical pump pulse induce a first surface wave on the material traveling in a first direction, and directing a first optical probe pulse at the surface of the material, wherein the optical pulse probe is diffracted by the first surface wave. The method also includes determining a first variation in a transient optical response of the material due to the first surface wave. The method further includes directing a third optical pump pulse and a fourth optical pump pulse towards the material, wherein the third optical pump pulse and the fourth optical pump pulse induce a second surface wave on the material traveling in a second direction, and determining a second variation in a transient optical response of the material due to the second surface wave. The method also includes based on the first variation and second variation, determining at least a first and a second stress component of a stress tensor, wherein the first stress component represents a stress in a first direction and the second stress component represents a stress in a second direction.

This overview is provided to introduce a selection of concepts in a simplified form that are further described below in the Detailed Description. This discussion is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

FIG. 3A illustrates a pump light pulse incident onto the surface of a substrate wafer and generating a strain pulse propagating away from the free surface of said substrate.

FIG. 4A illustrates the possible form of a measurement of the change in the intensity of the reflected probe light as a function of the time delay of the probe light pulse relative to the pump light pulse.

FIG. 4B illustrates the result of removing the background signal from the signal shown in FIG. 4A.

FIG. 6D depicts an example of a method for measuring multi-dimensional stress components at a depth of a material.

DETAILED DESCRIPTION

Figure 1:
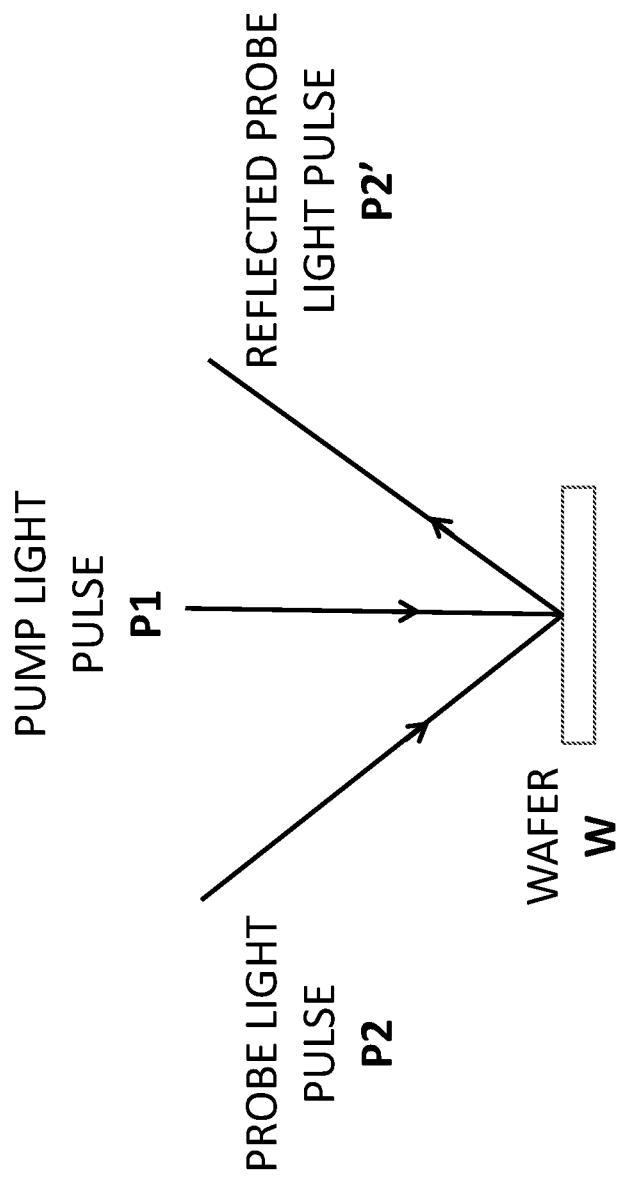
FIG. 1 depicts a simplified diagram for measuring stress in a material.

In the following detailed description, references are made to the accompanying drawings that form a part hereof, and in which are shown by way of illustrations specific embodiments or examples. These aspects may be combined, other aspects may be utilized, and structural changes may be made without departing from the spirit or scope of the present disclosure. The following detailed description is therefore not to be taken in a limiting sense, and the scope of the present disclosure is defined by the appended claims and their equivalents.

Previous methods for determining a stress in materials such as thin films have only been able to determine a single pressure value at the surface of the material. While such a pressure value is useful, additional details about the stress in a material are desirable. In particular, determining multiple multidimensional components in a stress tensor for a location in or on a material would be useful in understanding the state of the material and its acceptability for certain applications. In addition, being able to understand multidimensional stresses at a depth of the material also provides additional insights not previously available. The present disclosure provides for systems and methods to determine such multidimensional stresses, among other benefits.

The stress that is present in a material may be specified through a stress tensor $\sigma$. The components of this tensor are the coefficients $\sigma_{\alpha\beta}$ where the indices $\alpha$ and $\beta$ run from 1 to 3. In Cartesian coordinates, the indices 1 to 3 may correspond to each of the Cartesian axes, i.e., the x-axis, the y-axis, and the z-axis. Thus, for example, $\sigma_{xx}$ indicates the force per unit area acting in the x-direction of the material which lies normal to the x-direction, i.e., a force across a plane perpendicular to the x-direction. Similarly, $\sigma_{yy}$ indicates the force per unit area acting in the y-direction of the material which lies normal to the y-direction, i.e., a force across a plane perpendicular to the y-direction. At a free surface of a material, i.e., a surface which is not subjected to any external forces, the normal component of the stress must vanish. Thus, for a substrate which has a surface lying in a plane normal to the z-direction, the component $\sigma_{zz}$ of the stress tensor must vanish at the surface. However, the components $\sigma_{xx}$ and $\sigma_{yy}$ of the stress tensor at the surface may be non-zero. In some situations of interest these two components may be equal. In such circumstances it is customary to specify the stress by the in-plane pressure P defined as $P=-\sigma_{11}=-\sigma_{22}$. While some prior systems were directed to determining a single in-plane pressure P at a surface, embodiments of the systems and methods described herein are directed at obtaining the multidimensional stress components in the form of individual stress tensor coefficients $\sigma_{\alpha\beta}$, both at the surface and at different depths in the test material.

In accordance with the teaching of the present disclosure, a light pulse is directed onto a sample that includes a substrate. The light pulse is partially absorbed in the sample, which subsequently transfers energy to the materials comprising the sample. Associated with the transfer of energy is a small, localized transient change in the sample's optical response. That is, there is manifested at least one transient and measurable response of the sample to the pump pulse of optical radiation.

A measured transient response or responses can take a number of forms including at least one of a determination of a modulated change $\Delta R$ in an intensity of a reflected portion of a probe pulse, a change $\Delta T$ in an intensity of a transmitted portion of the probe pulse, a change $\Delta P$ in a polarization of the reflected probe pulse, a change $\Delta\phi$ in an optical phase of the reflected probe pulse, and a change in an angle of reflection $\Delta\beta$ of the probe pulse, each of which may be considered as a change in a characteristic of a reflected or transmitted portion of the probe pulse. By way of example, the change in reflectivity $\Delta R$ may be determined by analyzing the intensity of a reflected probe light. It should be appreciated that other transient responses are also possible to determine. By determining and analyzing these changes, multidimensional stress components for a particular point in a material, including a point at a particular depth within a material, can be determined through the methods and processes described herein.

In one embodiment of this technology, the time-dependence of the change in optical reflectivity $\Delta R(t)$ of the reflected probe beam is of interest. The observed change in reflectivity is typically in the range of about $10^{-3}$ to $10^{-6}$.

Turning to the figures, FIG. 1 depicts a simplified diagram for measuring stress in a material. A pulsed laser generates a pump light pulse P1 that is directed at a point on a material, such as wafer W, for which measurement of the stress components is desired. The pump light pulse is partially absorbed by the wafer W, generating a strain pulse in the wafer W traveling through the material in a direction normal to the plane formed by the surface of the wafer W. A probe light pulse P2 is also generated and directed towards substantially the same point on the material. The probe light pulse P2 interacts with the wafer W and is affected by the strain pulse propagating through the wafer W. As part of that interaction, the probe light pulse reflects at the surface of the wafer W and at the strain wave. The reflected probe light pulse P2' is then measured and analyzed to determine stress components of the wafer W. The particular measurements and analysis performed are discussed in more detail below.

Further, this simplified diagram serves as a reference for the discussion herein. More detailed embodiments of systems suitable for determining stress components in a material are discussed below with reference to FIGS. 7-10.

Figure 2:
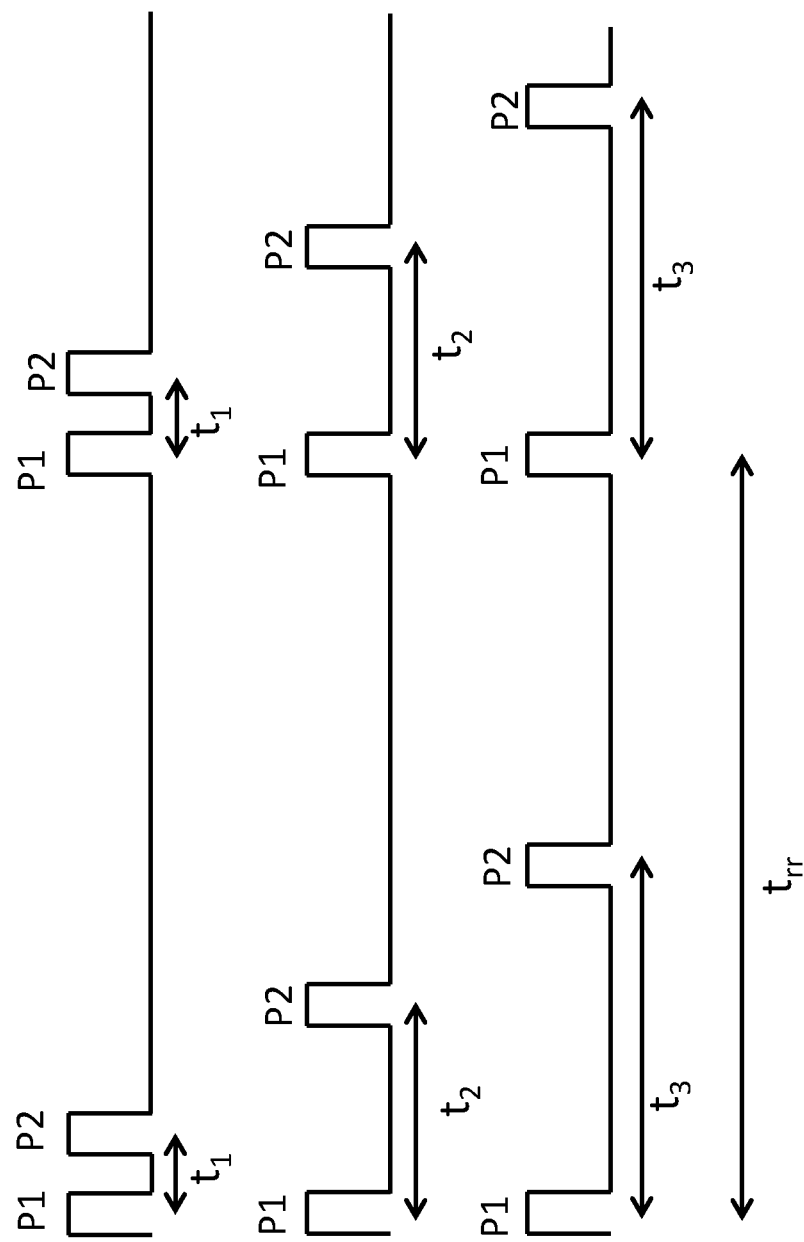
FIG. 2 illustrates various time delays between the application of a pump pulse and a subsequent application of a probe pulse.

Referring to FIG. 2, each pump light pulse P1 applied to the sample is followed by a probe light pulse P2. FIG. 2 illustrates various time delays $t_1$, $t_2$, and $t_3$ between the application of a pump pulse P1 and a subsequent application of a probe pulse P2. This time can be varied up to the time $t_{rr}$ between successive pump light pulses which is the reciprocal of the repetition rate f of the laser. It is desired to determine the change in the intensity of the reflected probe light $\Delta I_{probe}(t)$ as a function of the time delay t between the pump and the probe.

Figure 3B:
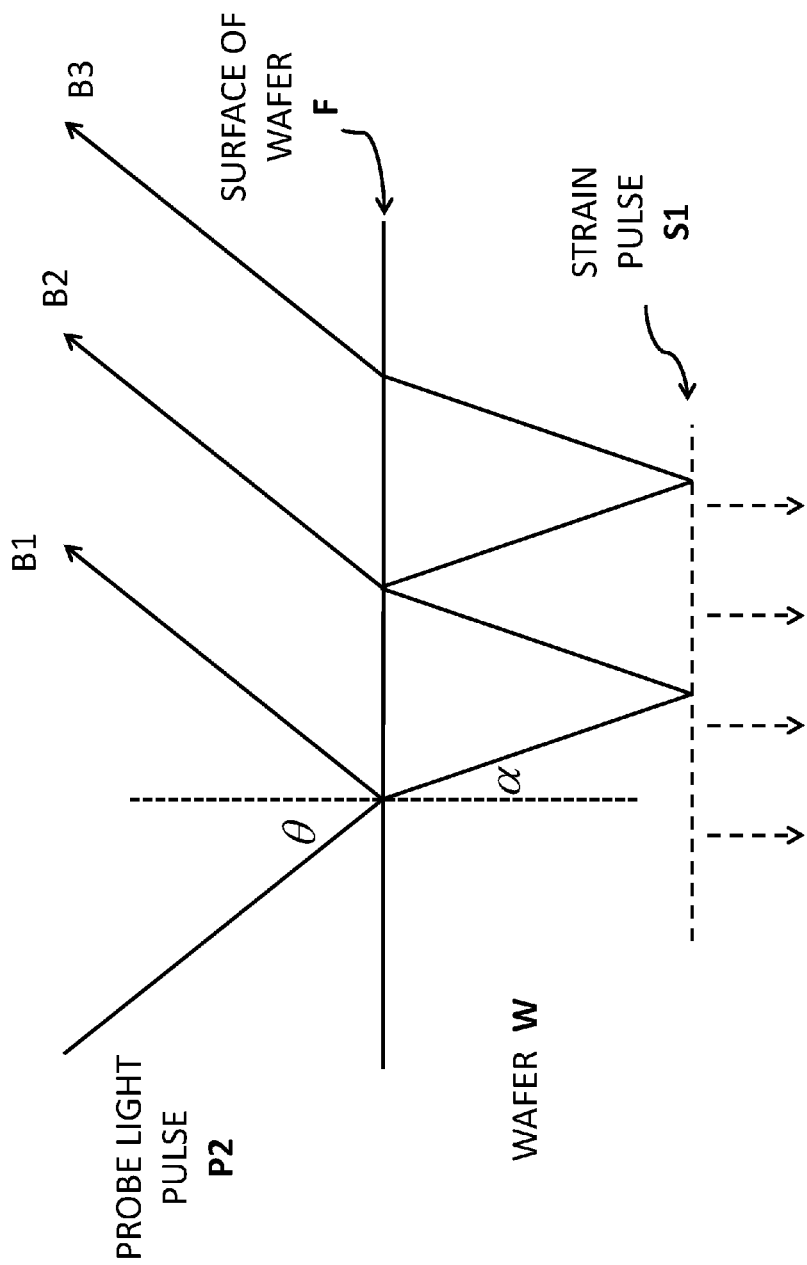
FIG. 3B illustrates a probe light pulse incident onto the surface of a substrate wafer and being reflected at the substrate surface and at a strain pulse propagating within the substrate.

Reference is now made to FIGS. 3A and 3B. A short duration light pulse P1 (the pump light pulse) is directed onto an area of the substrate wafer. The light is absorbed in the wafer. A stress is produced in the region where the light is absorbed. As a result of this suddenly-produced stress, a strain pulse S1 is launched which propagates into the wafer.

The propagation of the strain pulse S1 is detected through a measurement of the change in the optical properties of the structure. These changes are determined by means of the time-delayed probe light pulse P2 applied at a time t after the application of the pump pulse P1, as shown in FIG. 2. The probe pulse P2 is directed onto the same region of the substrate wafer where the pump light pulse was absorbed and where the strain was generated.

The propagating strain causes a transient optical response (TOR) comprising a change in (a) the intensity of the reflected probe light, (b) the polarization of the reflected probe light, (c) the phase of the reflected probe light, and (d) the propagation direction of the reflected probe light. These changes arise because, when the probe light pulse P2 propagates through the wafer W, it is partially reflected at the strain pulse S1. A measurement of one or more of these transient optical responses can be used to deduce the stress in the wafer W. This determination of the stress may be carried out by methods which are given below. The methods below refer to the particular example in which the change $\Delta I_{probe}(t)$ in the intensity of the reflected probe light is the TOR which is determined.

When the probe light pulse is directed at the sample it is partially reflected at the upper surface F of the wafer W, and at the propagating strain pulse S1. These two reflections give rise to the components B1 and B2 of the reflected probe light as shown in FIG. 3B. The amplitude of B1 is much larger than the amplitude of the component B2 arising from the reflection of light at the strain pulse S1. There will also be some further components such as B3 which arise from multiple reflections of the light at the strain pulse. However, because the reflection of light at the strain pulse is very small, these components arising from multiple reflections at the strain pulse, like B3, will have a very small amplitude and may be neglected.

The optical phase of the component B1 is not affected by the propagation of the strain pulse. However, the phase of the component B2 varies with time because the strain pulse is moving and, hence, the plane in space on which the reflection occurs is different at different times. As a result of the propagation of the strain pulse S1, as time increases the component B2 interferes constructively or destructively with the reflected component B1 according to the difference in the optical path lengths that the two components have traveled. The optical path length for the component B2 changes at a rate determined by the velocity with which the strain pulse is propagating, and is also dependent on the angle α between the direction of propagation of the light in the wafer W and the direction normal to the surface of the wafer W. The rate of change of the optical path of component B2 is such that the interference between B2 and the component B1 passes from constructive to destructive and back to constructive over a characteristic time interval which is $$\tau_{osc} = \lambda/2nv\cos(\alpha), \qquad (1)$$

where λ is the wavelength of light, and n is the refractive index of the substrate wafer. The angle α, referred to herein as the angle of refraction, is related to the angle of incidence of the probe light through the Snell's law relation $$\sin(\alpha) = \sin(\theta)/n. \qquad (2)$$

In the case that there is some absorption of light in the wafer the amplitude of the oscillations will decrease with increasing delay time of the probe light. At probe delay time t the total length of the path traveled by the component B2 while inside the wafer is $2d/\tan(\alpha)$. After propagating this distance the amplitude of the probe pulse is decreased by a factor $$\exp\left[-\frac{d}{\zeta\tan(\alpha)}\right] = \exp\left[-\frac{vt}{\zeta\tan(\alpha)}\right] \qquad (3)$$

where $$\zeta = \frac{\lambda}{4\pi\kappa},$$

with κ being the absorption coefficient connected to the dielectric constant ∈ through the relation $$\in = (n+i\kappa)^2. \qquad (4)$$

From combining these results, it is found that the reflection of the probe light at the propagating strain pulse gives a variation in the intensity of the reflected probe light of the form $$\Delta I_{strain}(t) = A\cos\left(\frac{2\pi t}{\tau_{osc}} + \phi\right)\exp\left[-\frac{t}{\tau_{damping}}\right] \qquad (5)$$

where A is a factor dependent on the amplitude of the strain pulse, $\tau_{damping} = \zeta\tan(\alpha)/v$, and φ is a phase factor dependent on factors including but not limited to (a) the phase change of the probe light when it is reflected at the surface of the wafer, and (b) the phase change of the probe light on reflection at the strain pulse.

The absorption of the pump light in the sample results in changes in the intensity of the reflected probe light which are in addition to the change coming from the interaction of the probe with the propagating strain pulse considered above. These changes include, but are not limited to, (a) the change in reflection resulting from the transient change in the temperature of the region of the sample in which the pump light is absorbed, and (b) the transient change in the density of electrons and holes in this region. These effects give a "background" change in reflection intensity $\Delta I_{back}$ which varies smoothly with time and does not contain a component which oscillates as a function of time. Thus the total change in intensity is $$\Delta I_{probe} = \Delta I_{back}(t) + \Delta I_{strain}(t) \tag{6}$$

The relative strength of the two components $\Delta I_{back}(t)$ and $\Delta I_{strain}(t)$ depends on (a) the wavelength of the pump light, (b) the wavelength of the probe light, (c) the optical properties of the substrate material. Typically, the background term $\Delta I_{back}$ is larger than the strain term $\Delta I_{strain}(t)$.

Reference is now made to FIGS. 4A and 4B. FIG. 4A shows a possible form for $\Delta I_{probe}(t)$ under conditions such that the magnitude of $\Delta I_{back}(t)$ is significantly larger than the magnitude of $\Delta I_{strain}(t)$. The following procedure may be used in order to remove the background contribution and reveal the presence of the oscillatory component:

(1) A first estimate $\tau_{osc}'$ is made of the period $\tau_{osc}$. In the case that the oscillations are evident in the data as in FIG. 4A, this estimate can be made directly by estimating the time range T within which some number N of oscillations take place and then taking $\tau_{osc}'$ to be given by T/N. In the case that the oscillations are not directly visible, the theoretical value of the period for an unstressed substrate wafer can be used to estimate $\tau_{osc}'$.

(2) A modified signal given by the following relation is then found:

$$S(t) = -\tfrac{1}{4}\Delta I_{probe}(t + \tau_{osc}'/2) + \tfrac{1}{2}\Delta I_{probe}(t) - \tfrac{1}{4}\Delta I_{probe}(t - \tau_{osc}'/2) \tag{7}$$

The modified signal is the sum of two components namely $S_1(t)$ arising from $\Delta I_{strain}(t)$, and $S_2(t)$ arising from $\Delta_{back}(t)$. Thus $$S(t) = S_1(t) + S_2(t) \tag{8}$$

and $$S_1(t) = -\tfrac{1}{4}\Delta I_{strain}(t + \tau_{osc}'/2) + \tfrac{1}{2}\Delta I_{strain}(t) - \tfrac{1}{4}\Delta I_{strain}(t - \tau_{osc}'/2) \tag{9}$$

$$S_2(t) = -\tfrac{1}{4}\Delta I_{back}(t + \tau_{osc}'/2) + \tfrac{1}{2}\Delta I_{back}(t) - \tfrac{1}{4}\Delta I_{back}(t - \tau_{osc}'/2) \tag{10}$$

It can be seen from these equations that provided that (a) the period $\tau_{osc}$ of the oscillations is small compared to the time $\tau_{back}$ over which the oscillations decrease with the delay time between the pump and probe pulses, and (b) the estimate $\tau_{osc}'$ is close to the time $\tau_{osc}$, the difference between $S_1(t)$ and $\Delta I_{strain}(t)$ will be very small. However, since the background contribution varies slowly with time, the general magnitude of $S_2(t)$ will be much less than the magnitude of $\Delta I_{back}(t)$. As a specific example, suppose that $\Delta_{back}(t)$ is well-approximated by an exponential, i.e., suppose that $\Delta I_{back}(t) = B \exp(-t/\tau_{back})$, where B and $\tau_{back}$ are constants. Then $$S_2(t) = -\Delta I_{back}(t) \sin h^2(\tau_{osc}'/4\tau_2) \tag{11}$$

If, by example, $\tau_2 = 10\tau_{osc}'$ then $$S_2(t) \approx -\frac{\Delta I_{back}(t)}{1600}.$$

Thus since $S_1(t)$ is close to $\Delta I_{strain}(t)$ and $S_2(t)$ is very small, it follows that $S(t)$ must be a good approximation to $\Delta I_{strain}(t)$. FIG. 4B shows the form of $S_1(t)$ obtained by applying this procedure to the function shown in FIG. 4A.

(3) A fit is made to $S_1(t)$ using $$S_1(t) = A' \cos(2\pi t/\tau_{osc} + \phi)\exp(-t/\tau_{damping}) \tag{12}$$

where A', $\tau_{osc}$, $\phi$, and $\tau_{damping}$ are parameters which are adjusted to achieve a best fit.

Once the value of $\tau_{osc}$ is found, the value of the product of the refractive index n and the sound velocity v may be found using $$nv = \frac{\lambda}{2\tau_{osc}\cos(\alpha)}. \tag{13}$$

What follows is a description of a method and a system for the characterization of multidimensional stress components in a substrate wafer through the use of a short pump light pulse to excite the material to be investigated, and an optical probe to examine the material a short time after the application of the pump pulse. In accordance with embodiments, a signal processor, such as signal processor SP described below coupled to the system shown in FIGS. 7 and 8, analyzes the determined change $\Delta_{probe}(t)$ in the intensity of the reflected probe light or other transient optical response, and then calculates the amount of stress in the substrate wafer. A time-dependent change in the optical properties of the material, which may be manifested by a change in, by example, reflectivity or polarization, is measured and is associated with an amount of stress present in the substrate wafer.

The first step in determining multidimensional stress components for a material is the determination of the oscillation period $\tau_{osc}$ by the methods already described.

The next step is to determine the stress components for a multidimensional stress tensor based on the determined $\tau_{osc}$. Let v be the sound velocity in a bulk material, having substantially the same composition as the material of the substrate wafer W in a substantially stress-free state, and let n be the refractive index of this same material. Both v and n are modified due to the presence of stress in the substrate wafer. For stresses in the range normally encountered in substrates, the difference dv between the modified sound velocity and the velocity in the unstressed material is proportional to the stress, and the change dn in the refractive index is also proportional to the stress. Hence $$\frac{d\tau_{osc}}{\tau_{osc}} = -\frac{dv}{v} - \frac{dn}{n} - \frac{d\cos\alpha}{\cos\alpha} = -\frac{dv}{v} - \frac{dn}{n} - \frac{\sin^2\theta}{n^2 - \sin^2\theta}\frac{dn}{n} \tag{14}$$

The value of $d\tau_{osc}$ represents the difference between the $\tau_{osc}$ as determined above, and a reference oscillatory period for the bulk material in the substantially stress-free state. The reference oscillatory period for the bulk material may be determined experimentally using substantially the same methods as described above but applying them to the bulk material. The reference oscillatory period for the bulk material may also be determined analytically from values such as the velocity of the sound wave and the refractive index for the bulk material, which may be known or can be determined. The difference $d\tau_{osc}$ may be determined by comparing the $\tau_{osc}$ as determined for the sample with the reference oscillatory period.

We now consider the relation between dv and dn and the stress. For simplicity we consider here a substrate wafer composed of a material which has cubic symmetry, the extension to materials with other symmetry is straightforward. Let the normal to the surface of the substrate wafer lie in the z-direction. At a free surface the component $\sigma_{zz}$ must be zero. It is then possible from the results obtained in R. N. Thurston and K. Brugger, *Third-order elastic constants and the velocity of small amplitude elastic waves in homogeneously stressed media*, Physical Review 133, A1604 (1964) to show that the presence of stress results in a change in the velocity of a longitudinal strain wave propagating along the z-direction given by $$\frac{dv}{v} = \frac{1}{2c_{11}} \frac{[(c_{112}+c_{12})c_{11} - c_{12}(c_{111}+5c_{11})]}{c_{11}^2 + c_{11}c_{12} - 2c_{12}^2} (\sigma_{xx} + \sigma_{yy}). \quad (15)$$

In equation 16, $c_{11}$ and $c_{12}$ are second order elastic constants, and $c_{111}$ and $c_{112}$ are third order elastic constants.

The change dn in the refractive index can be expressed in terms of the elasto-optical constants (see, for example, P. Etchegoin, J. Kircher, and M. Cardona, *Elasto-optical constants of Si*, Physical Review B47, 10292 (1993)). These constants give the variation of the dielectric constant tensor with stress. In a material with cubic symmetry, the velocity of light is independent of direction and polarization. However, when $\sigma_{xx}$ and $\sigma_{yy}$ are non-zero, while $\sigma_{zz}=0$, the material becomes optically anisotropic, i.e., the velocity of light depends on propagation direction and polarization. For light propagating in the z-direction and polarized along the x-direction it is straightforward to show that provided that the imaginary part of the dielectric constant is small compared to the real part, the change in the effective refractive index is given by $$\frac{dn}{n} = \frac{P_{11}\sigma_{xx} + P_{12}\sigma_{yy}}{2n^2}, \quad (16)$$

where $P_{11}$ and $P_{12}$ are components of the elasto-optical tensor. For a light wave propagating in the z-direction and polarized along y the change is $$\frac{dn}{n} = \frac{P_{12}\sigma_{xx} + P_{11}\sigma_{yy}}{2n^2}. \quad (17)$$

Accordingly, based on equations 14-17, the stress components $\sigma_{xx}$ and $\sigma_{yy}$ can be determined if the oscillatory period is determined $\tau_{osc}$ for two polarizations of probe light pulses. For light which is not propagating along a direction of high symmetry a more complicated expression holds for dn/n, but provided that the tensor $P_{ij}$ is known, the calculation of dn/n is straightforward.

It is noted that even when the probe light is not directed to the sample surface at normal incidence (the z-direction), the direction of propagation of the probe light beam inside the sample may be close to the z-direction. In silicon, for example, the refractive index for wavelengths between 300 nm and 600 nm is greater than or equal to 4. By example, even if the angle of incidence $\theta$ is 45° and the refractive index is 4, the angle $\alpha$ has the value 10°. In this situation it would be a reasonable approximation to use the normal incidence formulas (Eqs. 16 and 17) for dn/n. In addition, in the example where the angle of incidence is $\theta$ is 45° and the refractive index is 4, the last term in equation 14, i.e., $$\frac{d\cos\alpha}{\cos\alpha}$$

which is equivalent to $$\frac{\sin^2\theta}{n^2 - \sin^2\theta} \frac{dn}{n},$$

equals 1/31. Thus, in such an example, the last term in equation 14 is smaller than the term dn/n by a factor of 31. Accordingly, in embodiments, the last term in equation 14 will be small and in some cases may be neglected. In embodiments where the probe light is at a normal incidence, the last term in equation 14 is zero.

The second and third order elastic constants have been measured for many materials including silicon and germanium (see H. J. McSkimin and P. Andreatch, *Measurement of third-order moduli of silicon and germanium*, Journal of Applied Physics 35, 3312 (1964)), and gallium arsenide (see J. R. Drabble and A. J. Brammer, *Third order elastic constants of gallium arsenide*, Solid State Communications 4, 467 (1966)). The elasto-optical constants are known for these materials (P. Etchegoin, J. Kircher, and M. Cardona, *Elasto-optical constants of Si*, Physical Review B47, 10292 (1993), P. Etchegoin, J. Kircher, M. Cardona and C. Grein, *Piezo-optical response of Ge in the visible-uv range*, Physical Review B45, 11,721 (1992), P. Etchegoin, J. Kircher, M. Cardona, C. Grein and E. Bustarret, *Piezo-optics of GaAs*, Physical Review 46, 15139 (1992)). The measurement of these parameters can be accomplished by a number of established methods. Thus an accurate measurement of $\tau_{osc}$ makes it possible to determine the multidimensional stress components, i.e., the stress tensor coefficients, in the substrate wafer as follows:

1. Determine the value of $\tau_{osc}$ for two different polarizations of the probe light, preferably two orthogonal polarizations.
2. By comparison of these determined values with Eqs. 14, 15, 16 and 17, the stress components $\sigma_{xx}$ and $\sigma_{yy}$ are determined.

Consider now a sample for which the ratio of $\sigma_{xx}$ to $\sigma_{yy}$ can be predicted. For example, there may be a cylindrical hole running through the substrate and this hole filled with a second material which exerts an outward stress of equal magnitude on all points on the boundary between the material and the substrate. This will result in a radial stress and also a hoop stress around the cylinder. The ratio of these stresses can be calculated for all positions in the vicinity of the cylinder. A single determination of $\tau_{osc}$ is then made using probe light with a known polarization direction relative to a line running from target location to the center of the cylinder. Because of the relationships of the stresses and the symmetries involved, only a single polarization of probe light needs to analyzed. From a determined value of $\tau_{osc}$ for the reflected probe pulse, it is then possible to make a determination of both stress components $\sigma_{xx}$ and $\sigma_{yy}$.

In the case that the values of the third order elastic constants or the elements of the elasto-optical tensor are not available it is also possible to proceed as follows:

1. Select a test sample wafer composed of the material of interest.
2. Determine $\tau_{osc}$ for a chosen polarization by the method described above.
3. Apply forces to the wafer so that at the point of measurement the wafer has a radius of curvature R.
4. Calculate the stress that this curvature induces at the surface of the wafer.

5. Determine the amount by which $\tau_{osc}$ changed and find the ratio of the change in stress to the change in $\tau_{osc}$.

The ratio obtained can then be used on any other substrate wafer of the same material to associate a measured change in with a stress in said substrate wafer.

This general approach just described in which a separate measurement is made on a test sample wafer is of particular value for use when measurements are made using a transient grating method for generating and detecting a strain pulse propagating along the surface (Rayleigh wave), as discussed below with reference to FIGS. 10-11. It is possible for those skilled in the art to calculate the change in the velocity of a Rayleigh wave due to stress but it is more complicated to derive a simple formula for this change analogous to Eq. 15.

In some embodiments it is also possible to determine a stress component for the z-direction, i.e., $\sigma_{zz}$. For a longitudinal wave propagating in the z-direction in a cubic crystal, the variation in the sound velocity due to stress may be represented as $$\frac{dv}{v} = \frac{1}{2c_{11}}\left[\frac{(c_{11}+c_{12})c_{11}-c_{12}(c_{111}+5c_{11})}{c_{11}^2+c_{11}c_{12}-2c_{12}^2}(\sigma_{xx}+\sigma_{yy}) + \frac{c_{111}(c_{11}+c_{12})-2c_{112}c_{12}+5c_{11}^2+5c_{11}c_{12}-2c_{12}^2}{c_{11}^2+c_{11}c_{12}-2c_{12}^2}\sigma_{zz}\right] \quad (18)$$

For light propagating in the z-direction and polarized along x, the change in the refractive index is $$\frac{\Delta n}{n} = \frac{P_{11}\sigma_{xx}+P_{12}(\sigma_{yy}+\sigma_{zz})}{2n^2} \quad (19)$$

It is possible to determine the three multidimensional stress components, e.g., $\sigma_{xx}$, $\sigma_{yy}$, and $\sigma_{zz}$, for geometries where ratios of at least two of the multi-dimensional stress components may be predicted. Some geometric symmetries may allow for predicting such ratios, such as the example provided above for the stress around a cylindrical hole filled with a second material. In that example, because there is a relationship between the radial stress and the hoop stress, measurements with two polarizations of probe light are sufficient to determine the multidimensional stress components $\sigma_{xx}$, $\sigma_{yy}$, and $\sigma_{zz}$.

Figure 5:
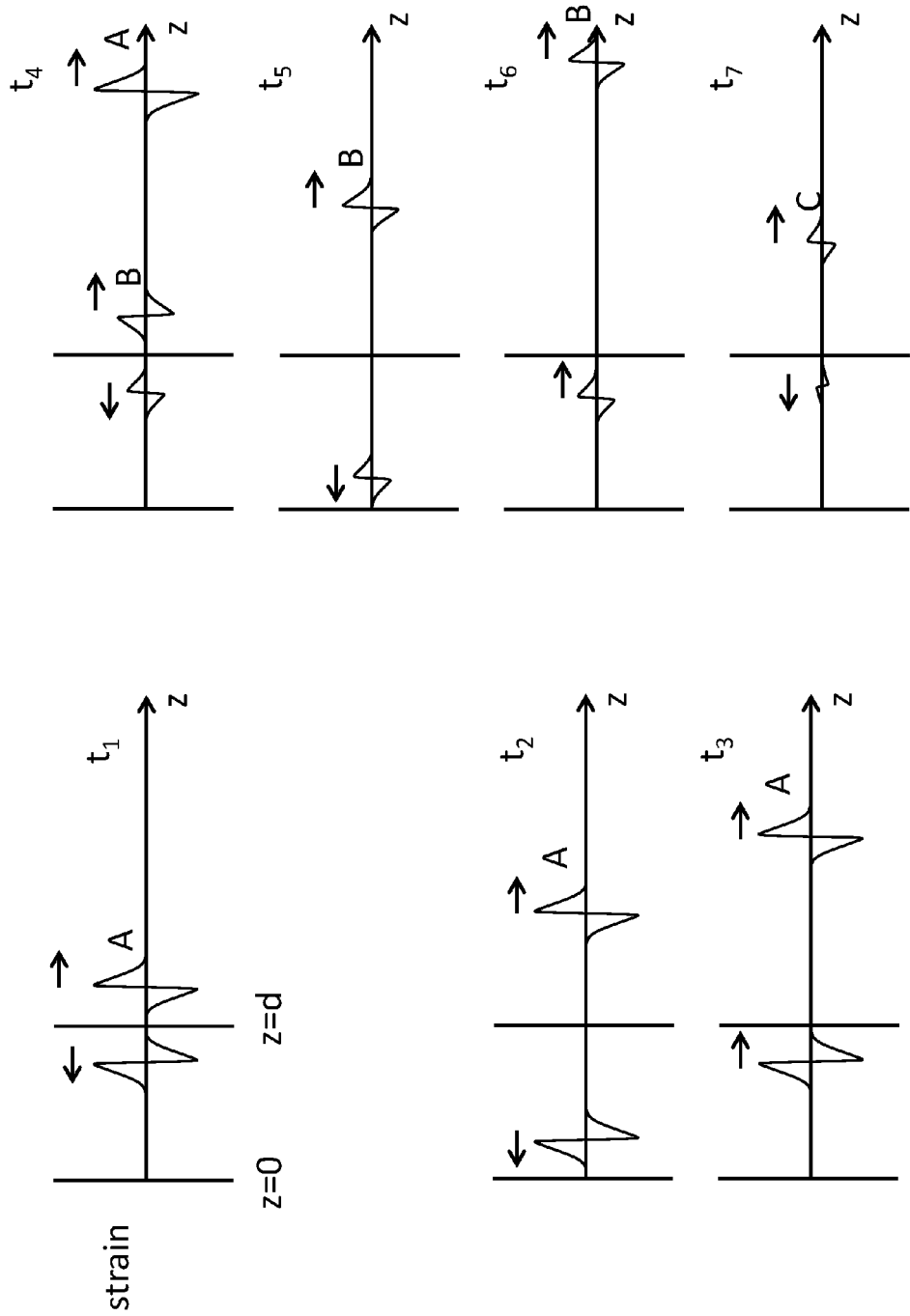
FIG. 5 shows the propagation of strain pulses in a sample which consists of a substrate wafer which has a thin film deposited onto its surface.

The systems and methods can also be used to make determinations of the multidimensional stress components in a substrate wafer that has a thin film deposited onto its surface provided that the film is sufficiently transparent to allow probe light to pass through it. Reference is now made to FIG. 5. The figure illustrates the strain pulses that occur when the film is transparent so that the pump light is absorbed only in the substrate and not in the film. The figure shows the strain pulses propagating in the substrate and in the film at a series of increasing times $t_1$ to $t_7$. The film thickness is d and the horizontal axis in each plot refers to the distance z from the sample surface. The absorption of the pump light results in a stress set up near the surface of the substrate. As shown for time $t_1$ this launches a strain pulse A propagating into the substrate and another pulse propagating into the film. The pulse that enters the film is reflected when it reaches the free surface of the film (z=0) and at $t_3$ is approaching the interface between the film and the substrate. The pulse is partially transmitted into the substrate giving pulse B and partially reflected back into the film (see $t_4$). A second reflection at the free surface of the film (see $t_5$) results in a third strain pulse C entering the substrate. Thus, whereas when no film is present on the substrate only a single strain pulse enters the substrate, the presence of a film results in multiple strain pulses in the substrate. Consequently the change in the intensity of the reflected probe light $\Delta I_{strain}(t)$ due to the strain will have a more complicated variation with time than as given by Eq. 5. However, it is still possible to determine the stress components in the substrate. Each strain pulse in the series A, B, has undergone one more partial reflection at the interface between the film and the substrate, and consequently the amplitude of successive pulses in the series decreases. After a time $\tau_0$ all strain pulses of significant amplitude will have entered the substrate and the intensity of the reflected probe light $\Delta I_{strain}(t)$ will be as given by Eq. 5. Then $\tau_{osc}$ can be determined by the method already described above, but using the determined value of $\Delta I_{strain}(t)$ only in the time range after the time $\tau_0$. From $\tau_{osc}$ the stress components can be determined.

In the case that some fraction of the pump beam is absorbed in the film, a stress will be set up in the film which will generate further strain pulses. But as described above, after some time $\tau_0$ there will cease to be strain pulses with significant amplitude entering the substrate and the intensity of the reflected probe light $\Delta I_{strain}(t)$ will again be well described by Eq. 5.

The description as given to this point refers to the determination of the multidimensional stress components in a substrate wafer in which the stress is uniform throughout the volume through which the strain pulse propagates. If the stress is non-uniform then the sound velocity v and the refractive index n will vary with position. Thus, as the time delay t between the pump and the probe light pulse increases, the period $\tau_{osc}$ of the oscillations will change. This makes it possible to determine the multidimensional stress components at different depths of the sample and, thus, obtain information about how stress changes as a function of depth. The procedure can be generally described as follows:

1. Select a depth range $z_1$ to $z_2$ below the surface of the substrate wafer in which the stress is to be determined.
2. Calculate the time range $t_1=z_1/v$ to $t_2=z_2/v$ during which the strain pulse is passing through this depth range.
3. Analyze the determined $\Delta I_{probe}(t)$ for the data in the time range $t_1$ to $t_2$ using the methods already described to find a value of $\tau_{osc}$ for this time range.
4. Use the methods already described to associate a stress with the value of $\tau_{osc}$.
5. Associate the stress with the average stress for the depth range $z_1$ to $z_2$.

Based on the foregoing description it should be clear that multiple methods and variations of those methods for determining multidimensional stress components in a substrate wafer are taught.

Figure 6A:
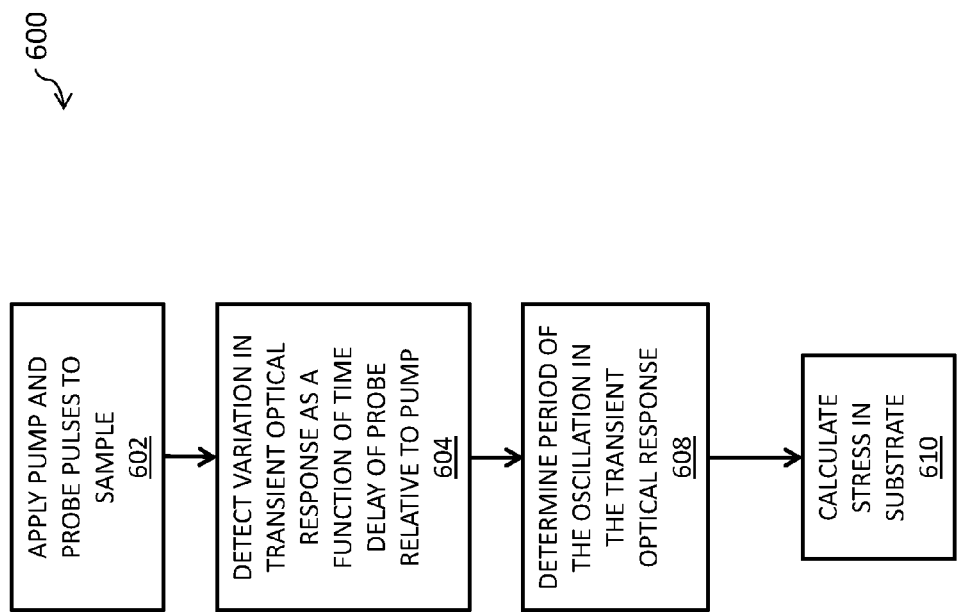
FIG. 6A depicts an example of a method for determining multidimensional stress components in a material such as a substrate wafer.

FIG. 6A depicts an example of a method 600 for determining multidimensional stress components in a material such as a substrate wafer. At operation 602, a sequence of optical pump pulses are applied to the material. As described above, individual optical pump pulses induce a propagating strain pulse in the material. Also in operation 602, for each of the optical pump pulses, at least one optical probe pulse is applied. As described above, the optical probe pulses may be applied with different time delays after the application of the corresponding optical probe pulses. At operation 604, variations in a transient optical response of the material are detected. These variations may be detected as variations in an intensity of the reflected optical probe pulses, or portions of the reflected optical probe pulses. At operation 608, a period of oscillation $\tau_{osc}$ for the detected variations of the transient optical response are determined. The period of oscillation $\tau_{osc}$ may be determined using any of the methods discussed above and as also discussed below with reference to FIG. 6C. From the determined period of oscillation $\tau_{osc}$, at least two multidimensional stress components are determined at operation 610. The stress components may be determined based on equations 14-17, as discussed above.

Figure 6B:
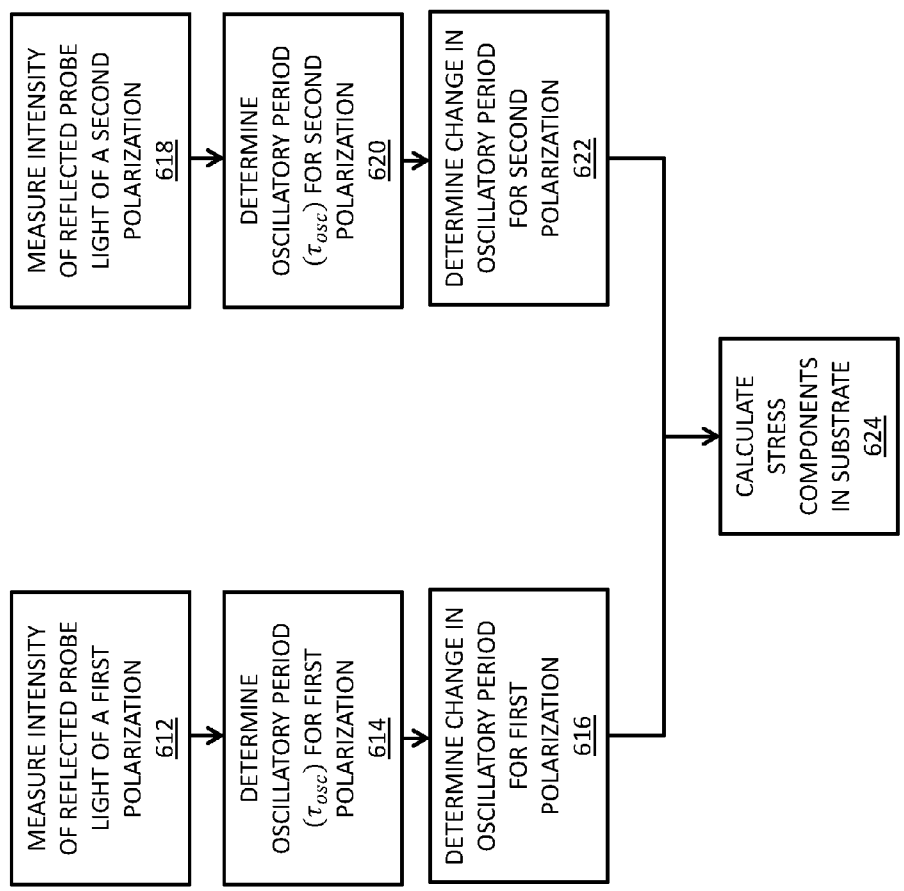
FIG. 6B depicts another example of a method for determining multidimensional stress components in a material.

FIG. 6B depicts an example of a method 611 for determining multi-dimensional stress components in a material. At operation 612, the intensity of a reflected probe light of a first polarization is measured. At operation 614, an oscillatory period $\tau_{osc}$ for the reflected probe light having the first polarization is determined. The period of oscillation $\tau_{osc}$ may be determined using any of the methods discussed above and as also discussed below with reference to FIG. 6C. At operation 616, a change or difference between the oscillatory period $\tau_{osc}$ determined in operation 614 from a reference oscillatory period for a substantially unstressed material is determined. The change or difference may be determined by comparing the oscillatory period $\tau_{osc}$ determined in operation 614 with the reference oscillatory period. The substantially unstressed material has substantially the same composition as the material currently being analyzed in method 611.

The operations 612-616 are essentially repeated in operations 618-622 for a probe light pulse having a second polarization. In embodiments, the first and second polarizations are relative to the sample. For example, the first and second polarization can be accomplished by rotating the material rather than modifying the light source. At operation 618, the intensity of a reflected probe light of a second polarization is measured. At operation 620, an oscillatory period $\tau_{osc}$ for the reflected probe light having the second polarization is determined. The period of oscillation $\tau_{osc}$ may be determined using any of the methods discussed above and as also discussed below with reference to FIG. 6C. At operation 622, a change or difference between the oscillatory period $\tau_{osc}$ determined in operation 620 from the oscillatory period for a substantially unstressed material is determined. The substantially unstressed material has substantially the same composition as the material currently being analyzed in method 611.

At operation 624, the values for the differences in oscillatory periods determined in operations 616 and 622 are then used to calculate or otherwise determine the multidimensional stress components for the material being analyzed. The stress components may be determined based on equations 14-17, as discussed above.

Figure 6C:
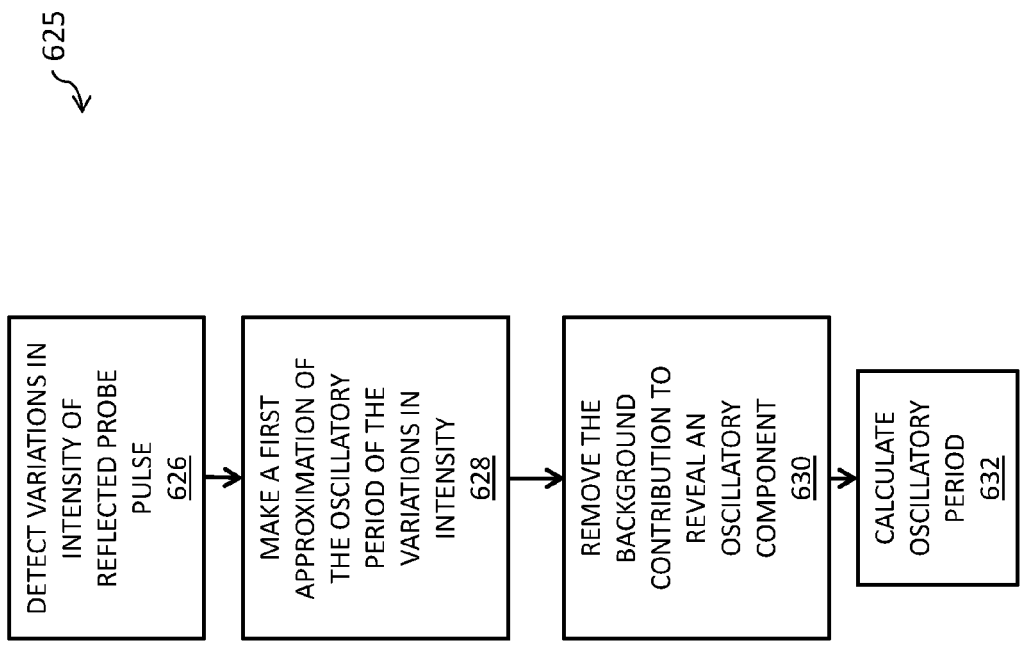
FIG. 6C depicts an example of a method for determining an oscillatory period $\tau_{osc}$ for a variation in a transient optical response.

FIG. 6C depicts an example of a method 625 for determining an oscillatory period $\tau_{osc}$ for a variation in a transient optical response. Method 625 provides an example that is specific to determining an oscillatory period $\tau_{osc}$ for a variation in the intensity of a reflected probe pulse. At operation 626, variations in intensity of a reflected probe pulse are detected. At operation 628, a first approximation of the oscillatory period of the variations in intensity is determined, as discussed above. At operation 630, based on the contribution relationships discussed above, the background contribution of the detected variation in intensity is removed from the analyzed signal. By removing the background contribution, a signal is revealed having an oscillatory component, as discussed above. From the signal with the oscillatory component, an oscillatory period $\tau_{osc}$ can be determined in operation 632.

Figure 6E:
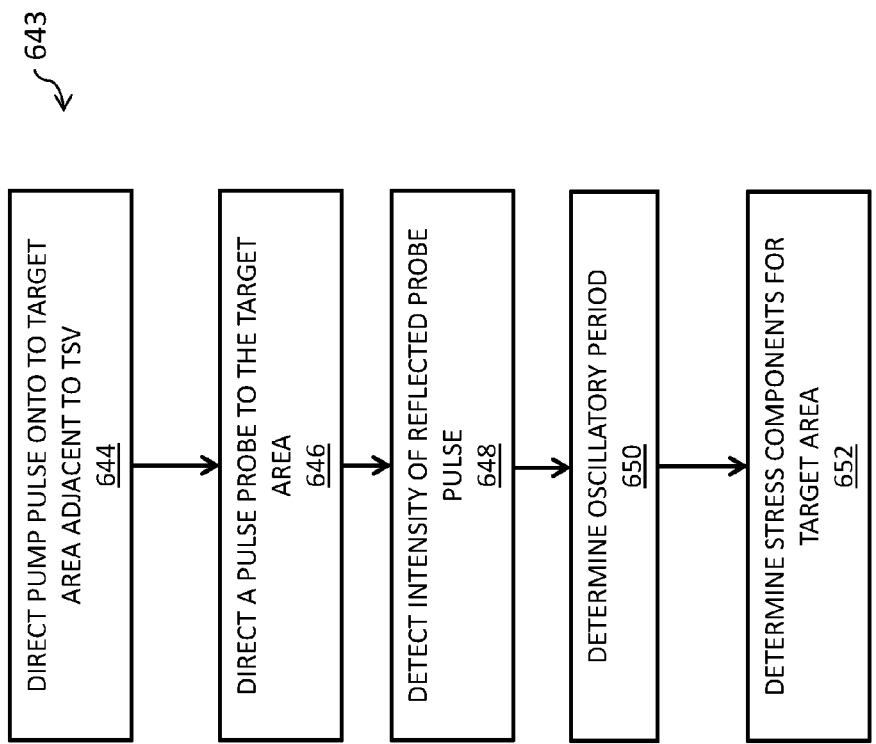
FIG. 6E depicts an example of a method for determining at least three multidimensional stress components in a semiconductor substrate proximate to a through-silicon via (TSV).

FIG. 6D depicts an example of a method 633 for measuring multi-dimensional stress components at a depth of a material, i.e., a point below the surface of the material. At operation 634, a depth range is selected. For instance, a distance $z_1$ to $z_2$ below the surface of the substrate wafer in which the multi-dimensional stress components are to be determined. At operation 636 a time range is calculated. The calculated time range indicates when the strain pulse is passing through the depth range selected in operation 634. At operation 638, a variation in a transient optical response, such as a variation in the intensity of a reflected probe pulse, is analyzed within the time range calculated in operation 636. From that analysis in operation 638, the oscillatory period $\tau_{osc}$ is determined at operation 640 using any of the methods described above. Based on the determined oscillatory period $\tau_{osc}$, the multi-dimensional stress components for the material can be determined in operation 642. The determined multi-dimensional stress components determined in operation 642 will be for the FIG. 6E depicts an example method 643 for determining at least two multidimensional stress components in a semiconductor substrate proximate to a through-silicon via (TSV). Where the TSV is formed from a geometry that allows for a ratio of $\sigma_{xx}$ to $\sigma_{yy}$ to be predicted, only a single polarization of a probe light pulse needs to be analyzed, unlike the method described above with reference to FIG. 6B where two polarizations of light are analyzed. For example, the TSV may be formed by a substantially cylindrical hole running through a substrate material that is filled with a second material. The second material exerts an outward stress of equal magnitude on all points on the boundary between the material and the substrate, resulting in a radial stress and also a hoop stress around the cylinder. The ratio of these stresses can be calculated for positions in the vicinity of the cylinder. The method 643 depicted in FIG. 6E may also be applied to other configurations other than a cylindrical hole, such as configurations where symmetries allow for the prediction of a ratio of $\sigma_{xx}$ to $\sigma_{yy}$. Additionally, method 643 may also be applied to configurations other than a TSV. For instance, any changes in material where the configuration has symmetries allowing for a prediction of a ratio of two or more multi-dimensional stress components.

At operation 644, a pump pulse is directed onto a target area that is adjacent to a TSV. At operation, 646 a probe pulse is applied with a known polarization direction relative to a line running from the target area to the center of the cylinder. At operation 648, the intensity of the reflected probe pulse is detected, and at operation 650 a determination of $\tau_{osc}$ is then made for the single polarization of the probe pulse, as described above. From a determined value of $\tau_{osc}$ for the reflected probe pulse, it is then possible at operation 652 to make a determination of both stress components $\sigma_{xx}$ and $\sigma_{yy}$ using equations 14-17, above, along with the predicted relationship or ratio between $\sigma_{xx}$ to $\sigma_{yy}$. Ascertaining the multidimensional stress components can include ascertaining the stress components as a function of depth at the target area using the methods described above. The step of ascertaining the stress in the semiconductor substrate can also include ascertaining the stress in various directions.

Figure 6F:
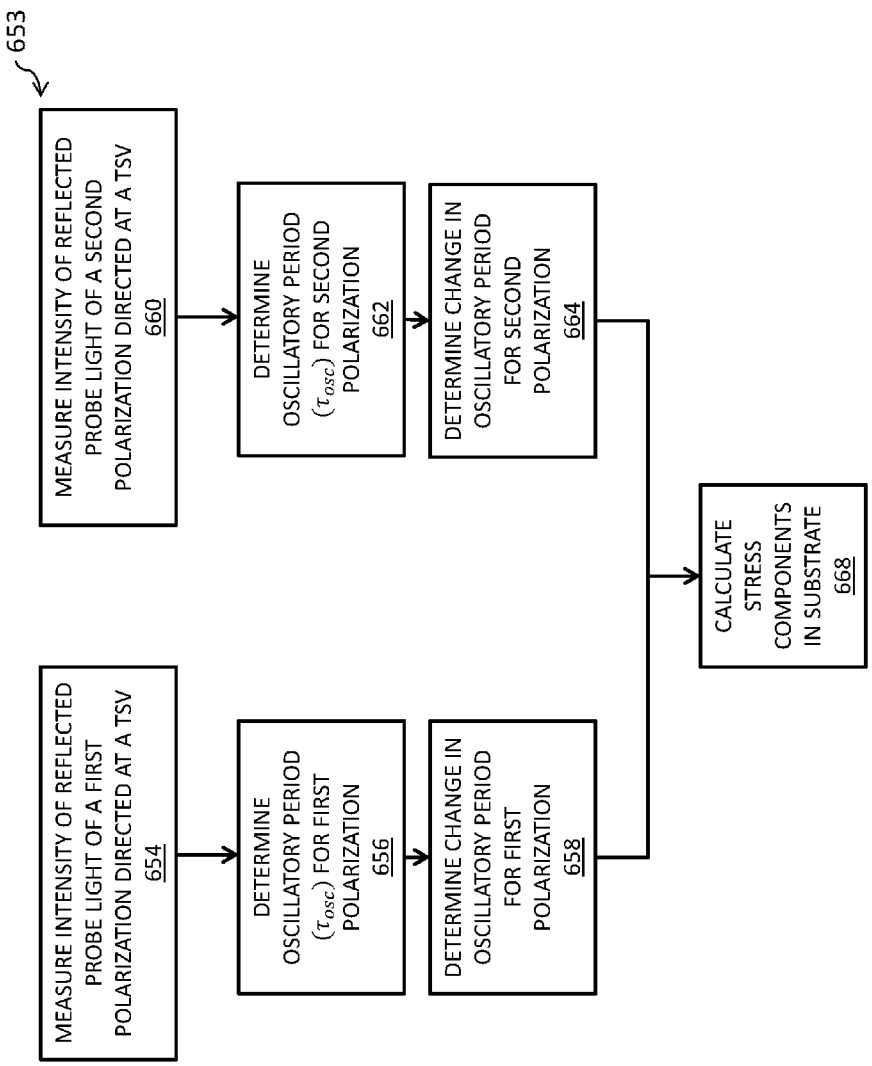
FIG. 6F depicts an example of a method for determining at least three multidimensional stress components in a semiconductor substrate proximate to a through-silicon via (TSV).

FIG. 6F depicts an example method 653 for determining at least three multidimensional stress components in a semiconductor substrate proximate to a through-silicon via (TSV). As discussed above, particular geometries of a TSV allow for a ratio of $\sigma_{xx}$ to $\sigma_{yy}$ to be predicted. Based in part on the geometry allowing for that prediction, the multidimensional stress components $\sigma_{xx}$, $\sigma_{yy}$, and $\sigma_{zz}$ can be determined for a target area proximate a TSV by analyzing two polarizations of probe pulses. At operation 654, the intensity of a reflected probe light of a first polarization is measured, where the probe light is directed at a target area adjacent a TSV. At operation 656, an oscillatory period $\tau_{osc}$ for the reflected probe light having the first polarization is determined. The period of oscillation $\tau_{osc}$ may be determined using any of the methods discussed above and as also discussed above. At operation 658, a change or difference between the oscillatory period $\tau_{osc}$ determined in operation 656 from the oscillatory period for a substantially unstressed material is determined. The substantially unstressed material has substantially the same composition as the material currently being analyzed in method 653.

The operations 654-658 are essentially repeated in operations 660-664 for a probe light pulse having a second polarization also directed at the target area adjacent to the TSV. In embodiments, the first and second polarizations are relative to the sample. For example, the first and second polarization can be accomplished by rotating the material rather than modifying the light source. At operation 660, the intensity of a reflected probe light of a second polarization is measured. At operation 662, an oscillatory period $\tau_{osc}$ for the reflected probe light having the second polarization is determined. The period of oscillation $\tau_{osc}$ may be determined using any of the methods discussed above. At operation 664, a change or difference between the oscillatory period $\tau_{osc}$ determined in operation 662 from the oscillatory period for a substantially unstressed material is determined. The substantially unstressed material has substantially the same composition as the material currently being analyzed in method 653.

At operation 668, the values for the differences in oscillatory periods determined in operations 658 and 664 are then used to calculate or otherwise determine the multidimensional stress components $\sigma_{xx}$, $\sigma_{yy}$, and $\sigma_{zz}$ for the target area adjacent the TSV. The stress components may be determined based on at least equations 18-19, as discussed above. Ascertaining the multidimensional stress components can include ascertaining the stress as a function of depth at the target area using the methods described above. The method 653 depicted in FIG. 6F may also be applied to other configurations other than a cylindrical hole, such as configurations where symmetries allow for the prediction of a ratio of $\sigma_{xx}$ to $\sigma_{yy}$. Additionally, method 643 may also be applied to configurations other than a TSV. For instance, any changes in material where the configuration has symmetries allowing for a prediction of a ratio of two or more multidimensional stress components.

An example apparatus or system for performing the methods and processes discussed herein is now described with reference to FIG. 7 and FIG. 8, which illustrate an example of an apparatus or system 700 suitable for practicing the methods and processes of the present disclosure. A pulsed laser L1 generates a sequence of light pulses at a repetition rate f. Light from the laser passes through a half-wave plate HWP1 and is then directed to a polarizing beam splitter PBS1. The beam splitter divides the laser output into a pump beam and a probe beam. These two beams have orthogonal polarizations. The relative amplitude of the two beams may be controlled by rotation of the half-wave plate HWP1. The most favorable intensities of the pump and probe beams depend on the characteristics of the sample under investigation. By example, the amplitude of the generated strain pulse is proportional to the intensity of the pump beam. However, if the intensity is too high there will be an undesired increase in temperature of the sample which will interfere with the measurements, or the sample may even be damaged.

In the depicted embodiment, the beam-splitter BS1 directs a part of the pump beam to the detector D1. The output of this detector is used for monitoring the power in the pump beam. The part of the pump beam passing directly through BS1 is chopped by an acousto-optic modulator AOM1 at a frequency between 100 kHz and 10 MHz. Dielectric mirror DM1 directs the modulated pump beam to the beam-splitter BS2. Part of the beam is deflected and absorbed in the beam block BB. The rest of the beam passes through BS2, and reaches lens L1 which focuses the beam to a spot on the surface of the sample.

In the depicted embodiment, the pump beam reflected from the sample returns through the lens L1. A part of the returning beam entering beam-splitter BS2 is directed to the detector D3. The output of this detector is used to determine the intensity of the pump beam reflected from the sample surface.

In the depicted embodiment, the probe beam coming from polarizing beam-splitter PBS1 is directed to beam-splitter BS3 which directs a small fraction of the beam to a detector D4. The output of this detector is used for determining the intensity of the probe beam. The part of the probe beam passing directly through BS3 is directed to the retro-reflector RR1 which is mounted on a translation stage RRTS. Dielectric mirror DM2 then directs the probe beam to lens L2 which focuses the probe beam onto the area of the sample on which the pump beam is directed. After reflection from the sample surface the probe beam is collected by lens L3. The beam then passes through a polarization analyzer PA1 to detector D2. The polarization analyzer is adjusted so as to pass the reflected probe beam and to prevent, as far as possible, light from the pump beam scattered at the surface of the sample from reaching the detector D2.

The position of the retro-reflector RR1 determines the time interval between the arrival of the pump pulse at the sample and the arrival of the probe pulse.

In the depicted embodiment, the sample S is mounted on a sample positioning stage SPS. This stage can translate the sample so as to select the area of the sample onto which the pump and probe beams are incident. Optionally, the stage SPS can also raise and lower the sample to achieve best focusing of the pump and probe beams. The stage SPS may also rotate to allow for multiple orientations of the sample S. For instance, different relative polarizations of the probe beam may be practically achieved by rotating the stage SPS.

Figure 8:
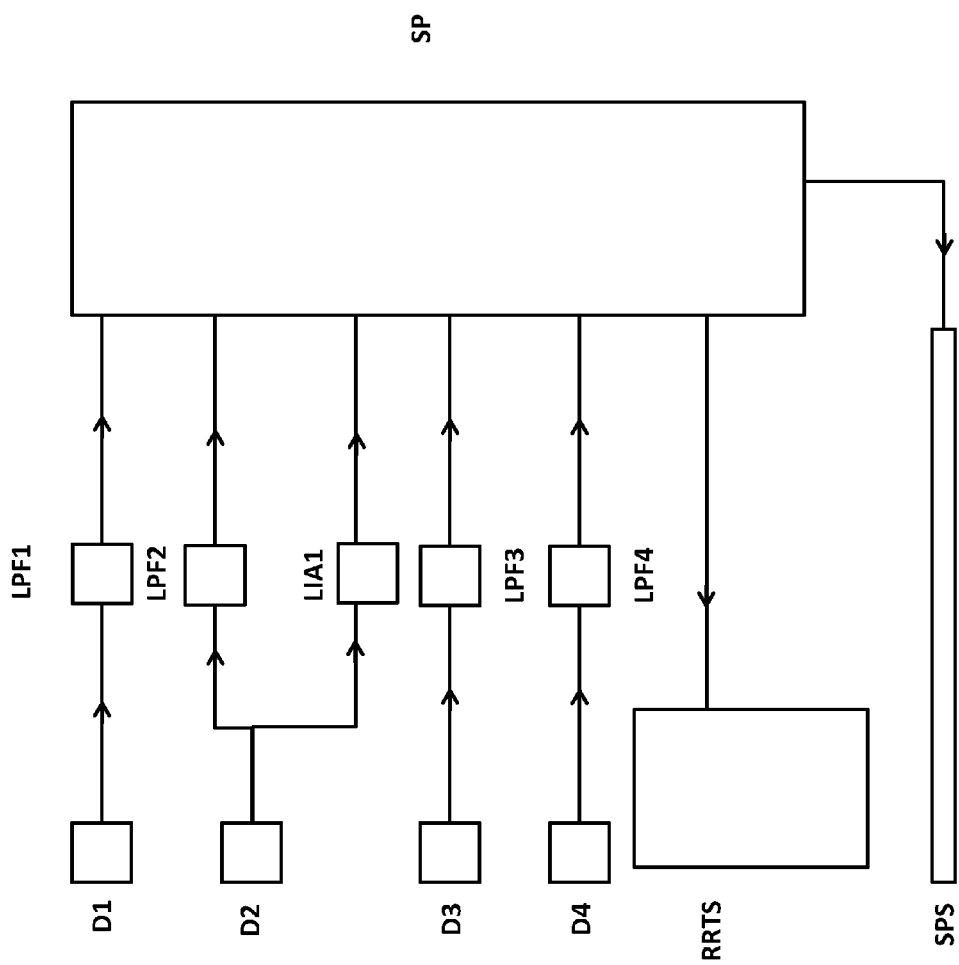
FIG. 8 illustrates the interconnections between the signal processor and components of the embodiment shown in FIG. 7.

FIG. 8 indicates the connections between the outputs of the detectors, the retro-reflector translation stage, the sample positioning stage SPS, and the signal processor SP. The signal from detector D1, which is used for determining the intensity of the pump beam, passes to the signal processor SP through a low pass filter LPF1. The signal from detector D4, which is used for determining the intensity of the incident probe beam, passes to the signal processor SP through a low pass filter LPF4. The signal from detector D3, which is used for determining the intensity of the incident probe beam, passes to the signal processor SP through a low pass filter LPF3.

From the output of detector D2 which receives the probe light after reflection from the sample, two signals are derived. The first signal is obtained by passing the amplified output of D2 through the low pass filter LPF2. This signal from LPF2 to the signal processor is used for determining the average intensity of the reflected probe light. The second signal is obtained by directing the output of D2 to the lock-in amplifier LIA1. The frequency of the reference voltage for the lock-in is the same as the operation frequency of the acousto-optic modulator AOM1. In order to provide an accurate measurement of this change in intensity, the output of the optical detector D2 is directed to the lock-in amplifier LIA1. This lock-in amplifier uses as a reference voltage a signal with the same frequency as is used to drive the acousto-optic modulator AOM1.

As shown in FIG. 8, the signal processor SP generates a signal which is directed to the translation stage RRTS. This signal directs the stage to translate to a desired position and thereby result in a chosen time delay between the pump and probe light pulses. The signal can also be used to direct the stage to rotate.

The signal processor SP may be a special purpose processor programmed specifically for performing the methods and processes discussed herein. The signal processor SP may also be a microprocessor or other type of processing unit used in combination with a computing device. The signal processor SP may also be connected to a memory for storing instructions, that when executed by the signal processor SP, perform the methods and processes described herein. The memory may be any type of computer-readable media, which may include computer-storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the signal processor SP. Any such computer storage media may be communicatively coupled to the signal processor SP, via wired or wireless connections. Computer storage media does not include a carrier wave or other propagated or modulated data signal. Computer storage media may be stored, incorporated into, or utilized in conjunction with computer storage devices. Further, in embodiments, signal processor SP may comprise multiple processors. In addition, the processing performed by signal processor SP may occur locally at the apparatus depicted in FIG. 7. In other examples, the signal processor SP or the functionality performed by the signal processor SP may be performed at a location away from the apparatus described in FIG. 7. In such examples, the functionality of signal processor SP may be performed by a server. The signal processor SP and other processors may be configured to perform the methods described herein. Further, a computer storage medium may be configured to store computer-executable instructions that when executed by a processor perform the methods described herein.

The output of the signal processor SP, e.g., the multi-dimensional stress components, may be presented by an output device such as a monitor or other output device known to those having skill in the art. In some examples, the output of the signal processor SP may also be accessed remotely such as over the Internet or other network.

In an embodiment, characteristics of the light pulses employed in the system of FIGS. 1 and 2 are as follows. The pump pulse has an energy of approximately 0.001 to 100 nJ per pulse, a duration of approximately 0.01 psecs to 100 psec per pulse, and a wavelength in the range 200 nm to 4000 nm. The laser pulse repetition rate (PRR) is in the range of 100 Hz to 5 GHz. As is shown in FIG. 7, the pump pulse train is intensity modulated. The modulation rate can be between 1 Hz and 100 MHz, depending on the PRR. The pump pulse is focused to form a spot on the sample surface of diameter in the range of approximately 10 micrometers to 20 micrometers, although smaller spot sizes, and hence smaller lateral resolutions, can also be employed. It should be appreciated that many alternatives are also possible.

The example apparatus described above is capable of measure optical properties, such as the intensity of the reflected probe beam, and determine (1) the transient change in the reflectivity of the probe beam. With modifications known to those with ordinary skill in the art, the apparatus can be used to determine (2) the change $\Delta T$ in the intensity of the transmitted probe beam, (3) the change $\Delta P$ in the polarization of the reflected probe beam, (4) the change $\Delta \phi$ in the optical phase of the reflected probe beam, and/or (5) the change in the angle of reflection $\Delta \beta$ of the probe beam. These quantities may all be considered as transient responses of the sample which are induced by the pump pulse. These measurements can be made together with one or several of the following: (a) measurements of any or all of the quantities (1)-(5) just listed as a function of the incident angle of the pump or probe light, (b) measurements of any of the quantities (1)-(5) as a function of more than one wavelength for the pump and/or probe light, (c) measurements of the optical reflectivity through measurements of the incident and reflected average intensity of the pump and/or probe beams; (d) measurements of the average phase change of the pump and/or probe beams upon reflection; and/or (e) measurements of the average polarization and optical phase of the incident and reflected pump and/or probe beams. The quantities (c), (d), and (e) may be considered to be average or static responses of the sample to the pump beam.

Figure 7:
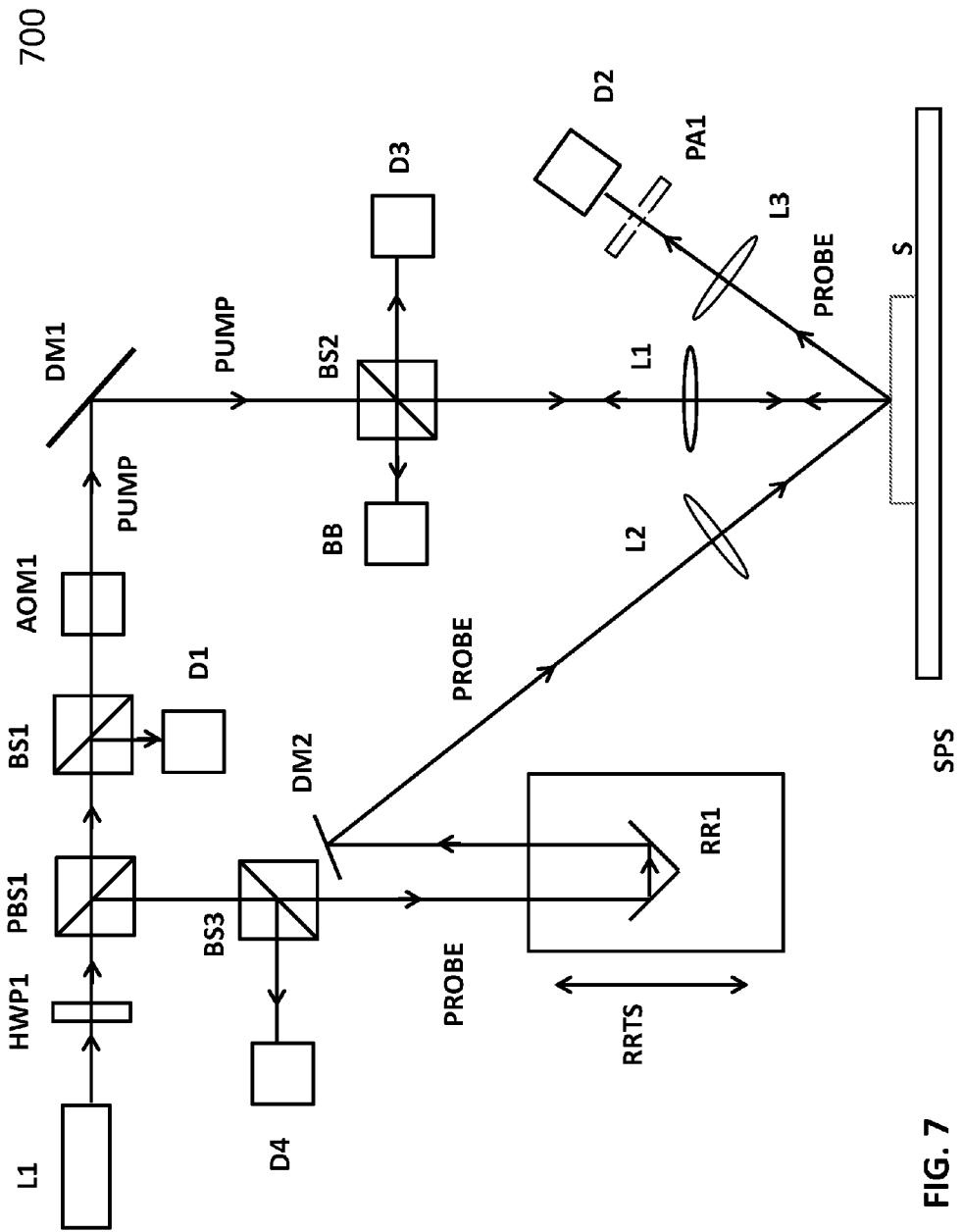
FIG. 7 is an example apparatus or system for performing the methods and processes discussed herein.

In the embodiment illustrated in FIG. 7, the same laser is used to furnish the pump and the probe pulses. It is within the scope of this disclosure to use an optical harmonic generator to generate one or more optical harmonics of the laser output, and then use one of these harmonics for the pump or for the probe. It is also within the scope of the present disclosure to use two separate lasers for the pump and probe beams. These lasers could each produce light of the same wavelength or could produce different wavelengths. The two lasers could be synchronized to produce light pulses at the same repetition rates. They could also be controlled so as to have different repetition rates thereby causing the time delay between the pump and probe light pulses to vary rapidly in time as described, for example, by A. Bartels, R. Cerna, C. Kistner, A. Thoma, F. Hudert, C. Janke, and T. Dekorsy, *Ultrafast time-domain spectroscopy based on high-speed asynchronous optical sampling*, Reviews of Scientific Instruments, 78, 035107 (2007). This method has the advantage that no retro-reflector RR1 and retro-reflector translation stage RRTS are needed, but the processing of the output of the detector D2 which measures the intensity of the reflected probe light is more complex.

Figure 9:
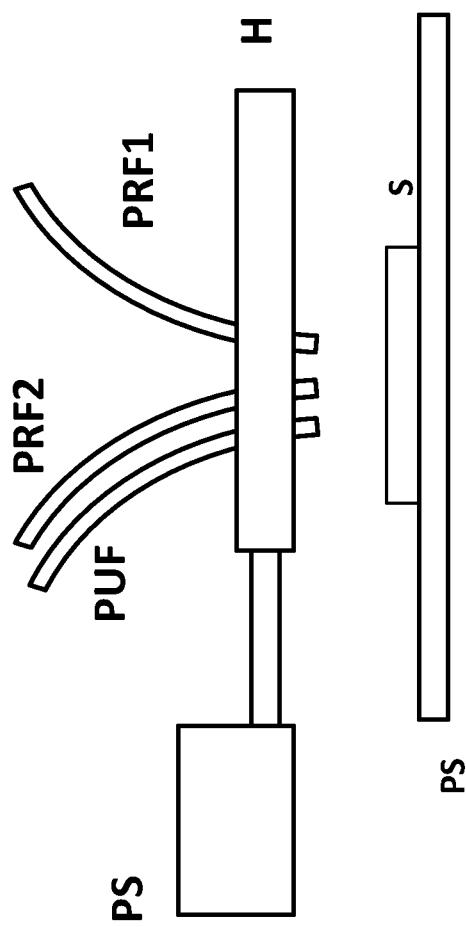
FIG. 9 illustrates an embodiment of the present disclosure wherein one or more optical fibers are positioned for delivering the pump beam and/or probe beam and for conveying away the reflected probe beam.

Referring to FIG. 9, it is also within the scope of the teaching of the present disclosure to deliver the pump pulse, or the probe pulse, or both the pump and probe pulses, through optical fibers. In one embodiment the pump pulse is delivered through the fiber PUF and the probe pulse is delivered through the fiber PRF2. The fiber PRF1 is employed for collecting the reflected probe light and directing it to a detector. For this embodiment the end of the optical fibers are affixed to a holder H which is attached to a positioning stage PS. The positioning stage has the ability to adjust the position of the holder so that the end of each fiber is at the optimal height above the upper surface of the sample S. In this manner the reliability and repeatability of the measurement cycle is improved, in that the size and position of the focused pump, probe, or pump and probe beams on the sample surface are independent of minor changes in the direction or profile of the laser output beams, or changes in the profile of the probe beam associated with the motion of any mechanical stage that may be used to effect the delay t. Preferably, the angular orientation between the end of the probe beam delivery fiber and the end of the reflected probe beam fiber is such as to optimize the gathering of reflected probe beam light from the sample surface. It is also within the scope of this disclosure to use one or more lenses following the fiber or fibers, in order to focus the output beams from the fibers onto the sample surface, or to collect the reflected probe light and to direct it into the fiber PRF1 of FIG. 9. It is also within the scope of the present disclosure to use the same fiber for the purpose of bringing the probe light to the sample and for collecting it and taking it to a detector. The ends of each or any of the fibers shown in FIG. 9 may have a reduced diameter so as to reduce the area of the surface of the sample onto which the light is directed or the area of the sample from which the probe light is collected (e.g., to a spot having a diameter of less than one micrometer).

In the embodiments as described above a sequence of pump pulses are generated and directed at the surface of the sample. Each pump pulse illuminates the same area of the sample with an intensity that varies smoothly across the area. However, it is also within the scope of the present disclosure to make measurements of the transient optical response by means of an induced transient grating method, such as one described by O. W. Phillion, O. J. Kuizenga, and A. E. Siegman, *Subnanosecond relaxation time measurements using a transient grating method*, Applied Physics Letters 27, 85 (1975). Referring now to FIG. 10, to induce a transient grating each pump pulse is divided into two or more components by means of a beam splitter or beam splitters, these components then pass through separate optical paths, and are all directed onto the same area of the surface of the sample. If the different components are directed onto the surface with different angles there will be locations within the area where the different components interfere constructively and other locations where the interference is destructive. Thus the total intensity of the pump light varies across the sample surface. In the case that only two components PU1 and PU2 are present, as shown in FIG. 10, the intensity will vary periodically across the same surface. The periodicity of the intensity, i.e., the spacing between successive points of maximum intensity, is determined by the wavelength of the pump light and the angles at which the different components of the pump light are incident onto the surface. When two components of the pump beam are directed as shown in FIG. 10, the intensity varies across the surface with a period of L=λ/2 sin θ. The amount of light absorbed in the structure and the amplitude of the generated stress pulse will vary across the surface with this same period. Consequently, the transient changes in the optical properties of the sample which result from the propagation of the stress pulse will have a component which varies periodically across the surface of the sample. This variation of the transient changes in the optical properties of the sample is equivalent to the production of a transient diffraction grating coinciding with the sample surface. When probe light PR1 is incident on the area excited by the pump, a part of the probe light will be diffracted, i.e., a part of the probe light will be reflected in a direction, or directions, away from the direction PSR of specular reflection. Measurement of the intensity of this diffracted probe light PDR by means of a detector as a function of the time delay t between the application of the pump and probe beams provides an alternate method for the characterization of the transient optical response produced by the propagating stress pulse.

Figure 10:
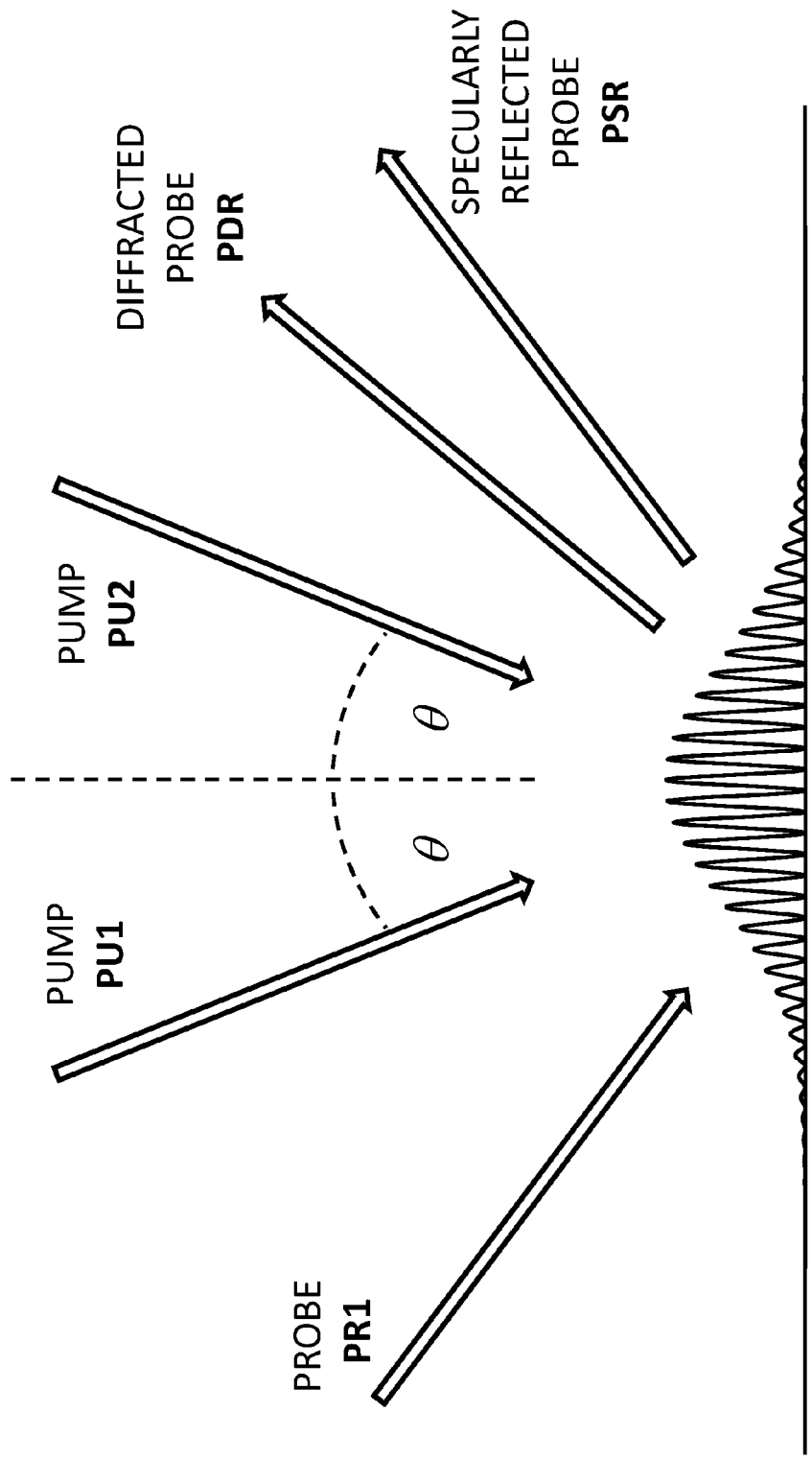
FIG. 10 depicts a simultaneous application of multiple pump pulses at different angles for inducing a transient optical grating, in accordance with an embodiment of the present disclosure.

In the case that the transient grating method as shown in FIG. 10 is employed, the pump pulses generate two distinct strain pulses. One strain pulse propagates into the substrate as shown in FIG. 3A and strain pulses propagate along the surface of the sample (Rayleigh waves). Both of these pulses result in a change in the intensity of the probe light reflected from the sample.

The strain pulse propagating into the sample results in a change in the intensity of the component of the reflected probe pulse labeled PSR in FIG. 10. This component is specularly reflected, i.e., reflected from the sample in a direction which makes the same angle to the normal to the surface as does the incident probe light. The intensity of the beam PSR varies with the time delay t of the probe relative to the pump period as given by Eq. 5. Measurement of the intensity of this beam can be used to find the product nv of the refractive index n of the substrate with the velocity v of the strain pulse as in Eq. 13.

The strain pulses which propagate along the surface result in the diffracted probe beam PDR as shown in FIG. 10. The intensity of this reflection oscillates in time and from the period $\tau_{Raylegh\ osc}$ of this oscillation the velocity of these surface waves can be determined. The spatial period of the grating is L=λ/2 sin(θ) where θ is the angle of incidence of the two components of the pump beam shown in FIG. 10. The velocity of the surface wave is found as $$v_{Rayleigh} = L/\tau_{Rayleighosc} \tag{20}$$

FIG. 10 shows one particular geometry for the beams in which there are two components of the pump beam each directed at an angle θ to the normal to the surface. The directions of these beams and the normal to the surface all lie in the same plane. If the normal to the surface is in the z-direction and the direction of the pump light lies in the x-z plane, then the amplitude of the light on the surface is proportional to $$\cos(k_x x - \omega t) + \cos(-k_x x - \omega t) = 2\cos(k_x x)\cos(\omega t) \tag{21}$$

where $k_x = k \sin \theta$ and ω is the frequency of the light. The intensity is proportional to the square of this and so the average of the intensity over one cycle of the light varies with x as $$2\cos^2(k_x x) = 1 + \cos(2k_x x). \tag{22}$$

The temperature rise of the surface of the sample is proportional to the intensity. The constant term in Eq. 22 results in the longitudinal sound pulse which propagates in the z-direction into the material. The cosine term gives rise to the surface sound waves (also called Rayleigh waves). These are two traveling sound waves of equal amplitude, one going in the positive x-direction and the other in the negative x-direction, or alternatively can be considered as a standing sound wave. The wavenumber q of these waves is $2k_x$ and so the wavelength $\lambda_s$ of the surface waves is $$\lambda_s = \frac{2\pi}{q} = \frac{\pi}{k_x} \tag{23}$$

Since $$k_x = k\sin\theta = \frac{2\pi}{\lambda}\sin\theta$$

where λ is the light wavelength, the sound wavelength is $$\lambda_s = \frac{\lambda}{2\sin\theta} \quad (24)$$

The surface waves result in ripples on the surface of the sample (a diffraction grating) with period $\lambda_s$. The frequency $f_s$ of the surface wave is $$f_s = \frac{v_s}{\lambda_s} \quad (25)$$

where $v_s$ is the surface wave velocity.

To make a measurement using the transient grating method a probe pulse is directed at time t onto the same area where the pump light is applied. Part of the probe light is diffracted by the ripples on the surface of the sample. The intensity of this diffracted probe light varies in time at the sound frequency $f_s$. The measurement of this frequency together with a knowledge of $\lambda_s$ can be used to give the velocity $v_s$ of the surface waves.

If the second and third order elastic constants are known, the change in $v_s$ can be calculated numerically. One could also calibrate a measurement system by making measurements of $v_s$ on a stress free sample and on a sample with known stress. The known stress could result from the application of forces to the sample so as to induce a known curvature of the sample from which the stress could be calculated.

With the particular geometry of the pump beams described above and shown in FIG. 10, the change in the height of the surface induced by the pump light pulses is a function of x, not of y. The ripples induced on the sample surface run along the y-direction. With this geometry the fractional change in the velocity $v_s$ could be written as $$\frac{dv_s}{v_s} = A\sigma_{xx} + B\sigma_{yy} \quad (26)$$

where A and B are coefficients that can be calculated from the second and third order elastic constants.

The coefficients A and B, and also the surface wave velocity vary with the orientation of the substrate, i.e., the relation between the normal to the surface and the crystallographic axes. They are also dependent on the direction in which the surface wave propagates across the surface of the substrate. Measurements for two propagation directions of the surface waves could be used to determine both $\sigma_{xx}$ and $\sigma_{yy}$.

Figure 11:
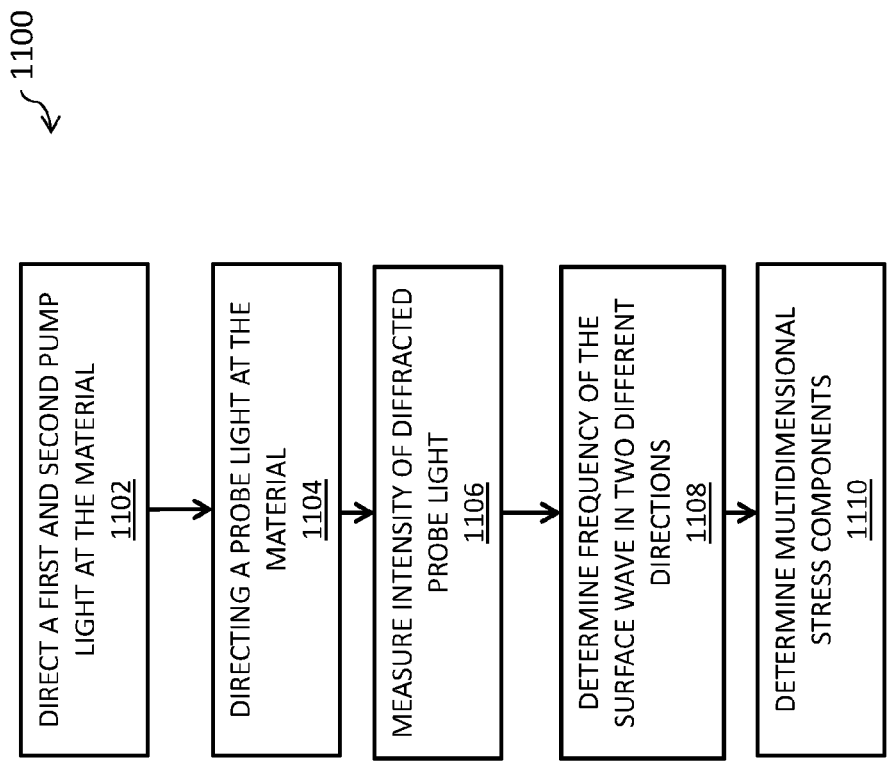
FIG. 11 depicts a method for determining multidimensional stress components on the surface of a material using an optical transient grating method.

FIG. 11 depicts a method 1100 for determining multidimensional stress components on the surface of a material using an optical transient grating method. At operation 1102, a first and second pump lights are directed at the material. The first and second pump lights cause a surface wave, as discussed above. At operation 1104, a probe light is directed at the material. As discussed above, the part of the probe light is diffracted by the surface wave. At operation 1106, the intensity of the diffracted probe light is measured over an amount of time. Based on variations in the intensity of the diffracted probe light, the frequency of the surface wave can be determined at operation 1108. At operation 1108, the frequency of the surface wave is determined for the surface wave traveling in two different directions. This determination can be achieved by rotating the material under the light sources and measuring the intensity at the rotated orientation in addition to the original orientation of the sample. Based on the determinations of the frequency of the surface wave made in operation 1108, multidimensional stress components may be determined at operation 1110. The multidimensional stress components may be determined using the equations discussed above.

The teachings of this disclosure can be applied to a number of-materials of wafer material of current interest in the semiconductor chip fabrication industry, including silicon, germanium, other semiconductors such as gallium arsenide and gallium nitride, silicon carbide and diamond. It should be realized, however, that the teachings of this disclosure are not limited for use only in the semiconductor chip fabrication environment. In general, the teachings of this disclosure can be employed to advantage in many applications wherein it is desired to measure the stress in a material.

The description and illustration of one or more examples provided in this application are not intended to limit or restrict the scope of the disclosure as claimed. For instance, while the multidimensional stress components have generally been discussed in a Cartesian coordinate system, the multidimensional stress components may be determined for different geometries or coordinate system, such as polar, spherical, cylindrical, or any other coordinate system. The examples, embodiments, and details provided in this application are considered sufficient to convey possession and enable others to make and use the best mode of claimed disclosure. The claimed disclosure should not be construed as being limited to any embodiment, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate embodiments falling within the spirit of the broader aspects of the general inventive concept embodied in this application that do not depart from the broader scope of the claimed disclosure.

The invention claimed is:

1. A method for determining multidimensional stress components in a material, the method comprising:
    applying a sequence of optical pump pulses to a surface of the material, individual pulses of the optical pump pulses inducing a propagating strain pulse in the material;
    for at least one of the optical pump pulses, applying at least one optical probe pulse;
    detecting variations in a transient optical response of the material to the optical probe pulses, the variations being due at least in part to the propagation of the strain pulse in the material;
    based on the detected variations in the transient optical response of the material, determining an oscillatory period for the detected variations;

comparing the determined oscillatory period to a reference oscillatory period for a substantially unstressed sample having a substantially similar composition as the material; and based on results of the comparing operation, determining at least a first and a second stress component of a stress tensor, wherein the first stress component represents a stress in a first direction and the second stress component represents a stress in a second direction.

2. The method of claim 1, wherein the detected variations in the transient optical response are variations in an intensity of one or more reflected optical probe pulses.

3. The method of claim 1, wherein the first and second stress components of the stress tensor are determined for a depth range below the surface of the material.

4. The method of claim 3, further comprising:
selecting the depth range $z_1$ to $z_2$ below the surface of the material; and
calculating the time range $t_1=z_1/v$ to $t_2=z_2/v$ during which the strain pulse is passing through this depth range, wherein v is a velocity of the strain pulse.

5. The method of claim 1, wherein the first and second stress components of the stress tensor are determined based on at least two of the following equations:

$$\frac{d\tau_{osc}}{\tau_{osc}} = -\frac{dv}{v} - \frac{dn}{n} - \frac{d\cos\alpha}{\cos\alpha}, \quad (1)$$

$$\frac{dv}{v} = \frac{1}{2c_{11}} \frac{[(c_{112}+c_{12})c_{11} - c_{12}(c_{111}+5c_{11})]}{c_{11}^2 + c_{11}c_{12} - 2c_{12}^2}(\sigma_{xx}+\sigma_{yy}), \quad (2)$$

$$\frac{dn}{n} = \frac{P_{11}\sigma_{xx} + P_{12}\sigma_{yy}}{2n^2}, \text{ and} \quad (3)$$

$$\frac{dn}{n} = \frac{P_{12}\sigma_{xx} + P_{11}\sigma_{yy}}{2n^2}, \quad (4)$$

wherein $c_{11}$ and $c_{12}$ are second order elastic constants, $c_{111}$ and $c_{112}$ are third order elastic constants, $P_{11}$ and $P_{12}$ are components of an elasto-optical tensor, n is the refractive index, $$\frac{dv}{v}$$

is a ratio of a difference in a velocity of a strain wave in a substantially unstressed material and a stressed material, $$\frac{dn}{n}$$

is a ratio of a difference in a refractive index in a substantially unstressed material and a stressed material, $$\frac{d\tau_{osc}}{\tau_{osc}}$$

is a ratio of a difference in an oscillatory period for a change in intensity of a reflected probe pulse and an oscillatory period for that resulting from a substantially unstressed material, α is the angle of refraction, $\sigma_{xx}$ is the first stress component, and $\sigma_{yy}$ is the second stress component.

6. The method of claim 1, wherein determining the oscillatory period further comprises removing a background signal from the detected variations to reveal an oscillatory component.

7. The method of claim 1, wherein the pump and probe pulses are directed to a target area on the surface adjacent to a cylindrical hole filled with a second material running through the first material, wherein the hole filled with the second material exerts an outward stress of substantially equal magnitude on all points on the boundary between the second material and the material.

8. The method of claim 7, wherein the cylindrical hole filled with a second material is a through-silicon via.

9. The method of claim 1, wherein the at least one optical probe pulse includes a first optical probe pulse having a first polarization and a second optical probe pulse having a second polarization.

10. The method of claim 9, wherein the polarization of the first optical probe pulse is orthogonal to the polarization of the second optical probe pulse.

11. A method for determining multidimensional stress components in a material using a system where multiple optical probe light pulses are reflected by the material, the method comprising:
measuring intensity of a first reflected probe light pulse having a first polarization;
determining a first oscillatory period for a change in intensity of the first reflected probe light pulse;
comparing the first oscillatory period to a reference oscillatory period for a substantially unstressed material;
measuring intensity of a second reflected probe light pulse having a second polarization;
determining a second oscillatory period for a change in intensity of the second reflected probe light pulse;
comparing the second oscillatory period to the reference oscillatory period; and
based on the comparison operations, determining at least a first and a second stress component of a stress tensor, wherein the first stress component represents a stress in a first direction and the second stress component represents a stress in a second direction.

12. The method of claim 11, wherein the first and second stress components of the stress tensor are determined for a point below the surface of the material.

13. The method of claim 12, further comprising:
selecting a depth range $z_1$ to $z_2$ below the surface of the material; and
calculating the time range $t_1=z_1/v$ to $t_2=z_2/v$ during which the strain pulse is passing through this depth range, wherein v is a velocity of the strain pulse.

14. The method of claim 11, wherein the first polarization is orthogonal to the second polarization.

15. The method of claim 11, wherein the method further comprises applying one or more optical pump pulses to the material, wherein individual pulses of the optical pump pulses induces a propagating strain pulse in the material.

16. The method of claim 11, wherein the first and second stress components of the stress tensor are determined based on at least two of the following equations:

$$\frac{d\tau_{osc}}{\tau_{osc}} = -\frac{dv}{v} - \frac{dn}{n} - \frac{d\cos\alpha}{\cos\alpha}, \quad (5)$$

$$\frac{dv}{v} = \frac{1}{2c_{11}} \frac{[(c_{112}+c_{12})c_{11} - c_{12}(c_{111}+5c_{11})]}{c_{11}^2 + c_{11}c_{12} - 2c_{12}^2}(\sigma_{xx}+\sigma_{yy}), \quad (6)$$

-continued $$\frac{dn}{n} = \frac{P_{11}\sigma_{xx} + P_{12}\sigma_{yy}}{2n^2}, \text{ and} \quad (7)$$

$$\frac{dn}{n} = \frac{P_{12}\sigma_{xx} + P_{11}\sigma_{yy}}{2n^2}, \quad (8)$$

wherein $c_{11}$ and $c_{12}$ are second order elastic constants, $c_{111}$ and $c_{112}$ are third order elastic constants, $P_{11}$ and $P_{12}$ are components of an elasto-optical tensor, n is the refractive index, $$\frac{dv}{v}$$

is a ratio of a difference in a velocity of a strain wave in a substantially unstressed material and a stressed material, $$\frac{dn}{n}$$

is a ratio of a difference in a refractive index in a substantially unstressed material and a stressed material, $$\frac{d\tau_{osc}}{\tau_{osc}}$$

is a ratio of a difference in an oscillatory period for a change in intensity of a reflected probe pulse and an oscillatory period for that resulting from a substantially unstressed material, α is the angle of refraction, $\sigma_{xx}$ is the first stress component, and $\sigma_{yy}$ is the second stress component.

17. The method of claim 11, wherein the first and second probe pulses are from a target area adjacent to a cylindrical hole filled with a second material running through the substrate, wherein the hole filled with the second material exerts an outward stress of substantially equal magnitude on all points on the boundary between the second material and the material.

18. The method of claim 17, wherein a third stress component representing a stress in a third direction is determined, and wherein the first stress component, second stress component, and third stress components are determined based on the following equations:

$$\frac{dv}{v} = \frac{1}{2c_{11}}\left[\frac{(c_{11}+c_{12})c_{11} - c_{12}(c_{111}+5c_{11})}{c_{11}^2 + c_{11}c_{12} - 2c_{12}^2}(\sigma_{xx}+\sigma_{yy}) + \frac{c_{111}(c_{11}+c_{12}) - 2c_{112}c_{12} + 5c_{11}^2 + 5c_{11}c_{12} - 2c_{12}^2}{c_{11}^2 + c_{11}c_{12} - 2c_{12}^2}\sigma_{zz}\right], \quad (1)$$

and $$\frac{\Delta n}{n} = \frac{P_{11}\sigma_{xx} + P_{12}(\sigma_{yy}+\sigma_{zz})}{2n^2}, \quad (2)$$

wherein $c_{11}$ and $c_{12}$ are second order elastic constants, $c_{111}$ and $c_{112}$ are third order elastic constants, $P_{11}$ and $P_{12}$ are components of an elasto-optical tensor, n is the refractive index, $$\frac{dv}{v}$$

is a ratio of a difference in a velocity of a strain wave in a substantially unstressed material and a stressed material, $$\frac{\Delta n}{n}$$

is a ratio of a difference in a refractive index in a substantially unstressed material and a stressed material, $\sigma_{xx}$ is the first stress component, $\sigma_{yy}$ is the second stress component, and $\sigma_{zz}$ is the third stress component.

19. The method of claim 11, wherein the cylindrical hole filled with a second material is a through-silicon via.

20. A system for determining multidimensional stress components in a material, the system comprising:
at least one light source, wherein the at least one light source generates an optical pump pulse and a first optical probe pulse, wherein the optical pump pulse and the first optical probe pulses are directed towards a target area;
at least one optical detector, wherein the optical detector detects variations in a transient optical response of the material to the first optical probe pulse, the variations being due at least in part to the propagation of a strain pulse in the material caused by the optical pump pulse; and
a processor, wherein the processor is configured to:
determine, based on the detected variations in the transient optical response of the material, a first oscillatory period for the detected variations;
compare the determined first oscillatory period to a reference oscillatory period for a substantially unstressed sample having a substantially similar composition as the material; and
based on results of the comparison, determine at least a first and a second stress component of a stress tensor, wherein the first stress component represents a stress in a first direction and the second stress component represents a stress in a second direction.

21. The system of claim 20, wherein:
the at least one light source generates a second optical probe pulse, wherein the second optical probe pulse has a polarization different horn a polarization of the first probe pulse;
the at least one detector detects variations in a transient optical response of the material to the second optical probe pulse; and
the processor is further configured to:
determine, based on the detected variations in the transient optical responses of the material, a second oscillatory period for the detected variations; and
compare the second oscillatory period to the reference oscillatory period.

22. The system of claim 21, wherein determining at least the first and the second stress component of the stress tensor is further based on a difference between the second oscillatory period and the reference oscillatory period.

23. The system of claim 21, wherein the polarization of the first probe pulse is orthogonal to the polarization of the second probe pulse.

24. The system of claim 21, wherein:
the target area is adjacent to a cylindrical hole filled with a second material running through the substrate, wherein the hole filled with the second material exerts an outward stress of substantially equal magnitude on all points on the boundary between the second material and the material; and
the processor is further configured to determine a third stress component representing a stress in a third direction, wherein the first stress component, the second stress component, and the third stress component are determined based on the following equations:

(1)

$$\frac{dv}{v} = \frac{1}{2c_{11}} \left[ \frac{(c_{11}+c_{12})c_{11} - c_{12}(c_{111}+5c_{11})}{c_{11}^2 + c_{11}c_{12} - 2c_{12}^2} (\sigma_{xx} + \sigma_{yy}) + \frac{c_{111}(c_{11}+c_{12}) - 2c_{112}c_{12} + 5c_{11}^2 + 5c_{11}c_{12} - 2c_{12}^2}{c_{11}^2 + c_{11}c_{12} - 2c_{12}^2} \sigma_{zz} \right], \quad (1)$$

and $$\frac{\Delta n}{n} = \frac{P_{11}\sigma_{xx} + P_{12}(\sigma_{yy} + \sigma_{zz})}{2n^2}, \quad (2)$$

wherein $c_{11}$ and $c_{12}$ are second order elastic constants, $c_{111}$ and $c_{112}$ are third order elastic constants, $P_{11}$ and $P_{12}$ are components of an elasto-optical tensor, n is the refractive index, $$\frac{dv}{v}$$

is a ratio of a difference in a velocity of a strain wave in a substantially unstressed material and a stressed material, $$\frac{\Delta n}{n}$$

is a ratio of a difference in a refractive index in a substantially unstressed material and a stressed material, $\sigma_{xx}$ is the first stress component, $\sigma_{yy}$ is the second stress component, and $\sigma_{zz}$ is the third stress component.

25. The system of claim 21, wherein determining the first and second oscillators period further comprises removing a background signal from the detected variations to reveal an oscillatory component.

26. The system of claim 20, wherein the first and second stress components of the stress tensor are determined based on at least two of the following equations:

$$\frac{d\tau_{osc}}{\tau_{osc}} = -\frac{dv}{v} - \frac{dn}{n} - \frac{d\cos\alpha}{\cos\alpha}, \quad (1)$$

$$\frac{dv}{v} = \frac{1}{2c_{11}} \frac{[(c_{112}+c_{12})c_{11} - c_{12}(c_{111}+5c_{11})]}{c_{11}^2 + c_{11}c_{12} - 2c_{12}^2} (\sigma_{xx} + \sigma_{yy}), \quad (2)$$

$$\frac{dn}{n} = \frac{P_{11}\sigma_{xx} + P_{12}\sigma_{yy}}{2n^2}, \text{ and} \quad (3)$$

$$\frac{dn}{n} = \frac{P_{12}\sigma_{xx} + P_{11}\sigma_{yy}}{2n^2}, \quad (4)$$

wherein $c_{11}$ and $c_{12}$ are second order elastic constants, $c_{111}$ and $c_{112}$ are third order elastic constants, $P_{11}$ and $P_{12}$ are components of an elasto-optical tensor, n is the refractive index, $$\frac{dv}{v}$$

is a ratio of a difference in a velocity of a strain wave in a substantially unstressed material and a stressed material, $$\frac{dn}{n}$$

is a ratio of a difference in a refractive index in a substantially unstressed material and a stressed material, $$\frac{d\tau_{osc}}{\tau_{osc}}$$

is a ratio of a difference in an oscillatory period for a change in intensity of a reflected probe pulse and the reference oscillatory period for that resulting from a substantially unstressed material, α is the angle of refraction, $\sigma_{xx}$ is the first stress component, and $\sigma_{yy}$ is the second stress component.

27. The system of claim 20, wherein the target area is adjacent to a cylindrical hole filled with a second material running through the first material, wherein the hole filled with the second material exerts an outward stress of substantially equal magnitude on all points on the boundary between the second material and the first material.

28. The system of claim 27, wherein determining at least the first and the second stress component of the stress tensor is further based on a predicted ratio between the first and second stress components.

29. The system of claim 20, wherein the first and second stress components of the stress tensor are determined for a point below a surface of the material.

30. The system of claim 29, wherein the processor is further configured to:
select a depth range $z_1$ to $z_2$ below the surface of the material; and
calculate the time range $t_1 = z_1/v$ to $t_2 = z_2/v$ during which the strain pulse is passing through this depth range, wherein v is a velocity of the strain pulse.

31. The system of claim 20, wherein determining the first oscillatory period further comprises removing a background signal from the detected variations to reveal an oscillatory component.

32. A method for determining multidimensional stress components in a material, the method comprising:
directing a first optical pump pulse and a second optical pump pulse towards the material, wherein the first optical pump pulse and the second optical pump pulse induce a first surface wave on the material traveling in a first direction;
directing a first optical probe pulse at the surface of the material, wherein the first optical pulse probe is diffracted by the first surface wave;
determining a first variation in a transient optical response of the material due to the first surface wave;

directing a third optical pump pulse and a fourth optical pump pulse towards the material, wherein the third optical pump pulse and the fourth optical pump pulse induce a second surface wave on the material traveling in a second direction;

determining a second variation in a transient optical response of the material due to the second surface wave; and based on the first variation and second variation, determining at least a first and a second stress component of a stress tensor, wherein the first stress component represents a stress in a first direction and the second stress component represents a stress in a second direction.

33. The method of claim 32, further comprising determining a first frequency of the first variation and determining a second frequency for the second variation.

34. The method of claim 33, wherein determining at least the first and the second stress component is based on the first frequency and the second frequency.

35. The method of claim 33, further comprising rotating the material prior to directing the third and fourth optical pump pulses.

* * * * *